United States Patent
Vernackt

(10) Patent No.: US 6,560,248 B1
(45) Date of Patent: May 6, 2003

(54) SYSTEM, METHOD AND ARTICLE OF MANUFACTURE FOR IMPROVED LASER DIRECT IMAGING A PRINTED CIRCUIT BOARD UTILIZING A MODE LOCKED LASER AND SCOPHONY OPERATION

(75) Inventor: Marc Vernackt, Overmere (BE)

(73) Assignee: Mania Barco NV, Ghent (BE)

(*) Notice: Subject to any disclaimer, the term of this patent is extended or adjusted under 35 U.S.C. 154(b) by 0 days.

(21) Appl. No.: 09/590,782

(22) Filed: Jun. 8, 2000

(51) Int. Cl.$^7$ .............................................. H01S 3/098
(52) U.S. Cl. ........................................ 372/18; 250/234
(58) Field of Search .......................... 372/18; 250/234; 356/237.2; 359/3, 5, 216

(56) References Cited

U.S. PATENT DOCUMENTS

| | | | | |
|---|---|---|---|---|
| 4,253,725 A | * | 3/1981 | Johnson | 350/6.91 |
| 4,577,933 A | * | 3/1986 | Yip et al. | 359/216 |
| 4,639,073 A | * | 1/1987 | Yip et al. | 359/315 |
| 4,890,289 A | | 12/1989 | Basu et al. | 372/33 |
| 5,312,396 A | | 5/1994 | Feld et al. | 606/11 |
| 5,526,171 A | * | 6/1996 | Warren | 359/285 |
| 5,561,676 A | | 10/1996 | Goldberg | 372/18 |
| 5,736,709 A | | 4/1998 | Neiheisel | 219/121.61 |
| 5,742,626 A | | 4/1998 | Mead et al. | 372/22 |
| 5,745,284 A | | 4/1998 | Goldberg et al. | 359/344 |
| 5,760,408 A | | 6/1998 | Kikuchi et al. | 250/492.2 |
| 5,761,111 A | * | 6/1998 | Glezer | 365/106 |
| 5,798,856 A | | 8/1998 | Suzuki et al. | 359/181 |
| 5,804,353 A | | 9/1998 | Cushner et al. | 430/306 |
| 5,812,308 A | | 9/1998 | Kafka et al. | 359/346 |
| 5,833,759 A | | 11/1998 | Haslow et al. | 134/1.3 |
| 5,840,239 A | | 11/1998 | Partanen et al. | 264/401 |
| 5,841,102 A | | 11/1998 | Noddin | 219/121.71 |
| 5,866,911 A | | 2/1999 | Baer | 250/458.1 |
| 5,870,176 A | | 2/1999 | Sweatt et al. | 355/53 |
| 5,874,011 A | * | 2/1999 | Ehrlich | 216/65 |
| 5,898,716 A | | 4/1999 | Ahn et al. | 372/6 |
| 5,909,306 A | | 6/1999 | Goldberg et al. | 359/341 |
| 5,910,255 A | | 6/1999 | Noddin | 216/18 |
| 5,930,606 A | | 7/1999 | McCulloch | 438/157 |
| 5,940,418 A | | 8/1999 | Shields | 372/22 |
| 5,948,172 A | | 9/1999 | Neiheisel | 134/1 |
| 5,956,354 A | | 9/1999 | Yan | 372/18 |
| 5,965,043 A | | 10/1999 | Noddin et al. | 219/121.71 |
| 5,966,390 A | | 10/1999 | Stingl et al. | 372/18 |
| 5,987,045 A | | 11/1999 | Albares et al. | 372/38 |
| 5,987,049 A | | 11/1999 | Weingarten et al. | 372/70 |
| 5,989,243 A | | 11/1999 | Goldenberg et al. | 606/7 |
| 5,989,283 A | | 11/1999 | Wilkens | 607/88 |
| 6,037,967 A | | 3/2000 | Allen et al. | 347/255 |
| 6,210,401 B1 | * | 4/2001 | Lai | 606/12 |
| 6,215,551 B1 | * | 4/2001 | Nikoonahad et al. | 356/237.2 |
| 6,271,514 B1 | * | 8/2001 | Thomas et al. | 250/234 |

OTHER PUBLICATIONS

"Barco Announces New LDI Technology," Press Press Release, Barco Graphics ETS Division, Gent, Belgium and Barco, Inc. South Windsor, CT, Oct. 30, 1999.

"Barco shows the first LDI with a solid state laser in action at IPC Expo," Press Release, Barco Graphics ETS Division, Gent, Belgium and Barco, Inc. South Windsor, CT, Apr. 4, 2000.

* cited by examiner

*Primary Examiner*—Paul Ip
*Assistant Examiner*—Hung T Vy
(74) *Attorney, Agent, or Firm*—Dov Rosenfeld; Inventek

(57) ABSTRACT

A system, method and article of manufacture is disclosed that provides an improved, higher efficiency, more accurate laser direct imaging on a photosensitive medium on a substrate using a ultraviolet, mode-locked laser having a low average power and a short pulse width. The ultraviolet, mode-locked laser is modulated in a scophony mode. The resulting in-scan edges having improved perpendicularity relative to the underlying substrate. The resulting cross scan beginning and end having improved perpendicularity relative to the underlying substrate. The improved perpendicularity resulting in improved accuracy over the prior art.

12 Claims, 17 Drawing Sheets

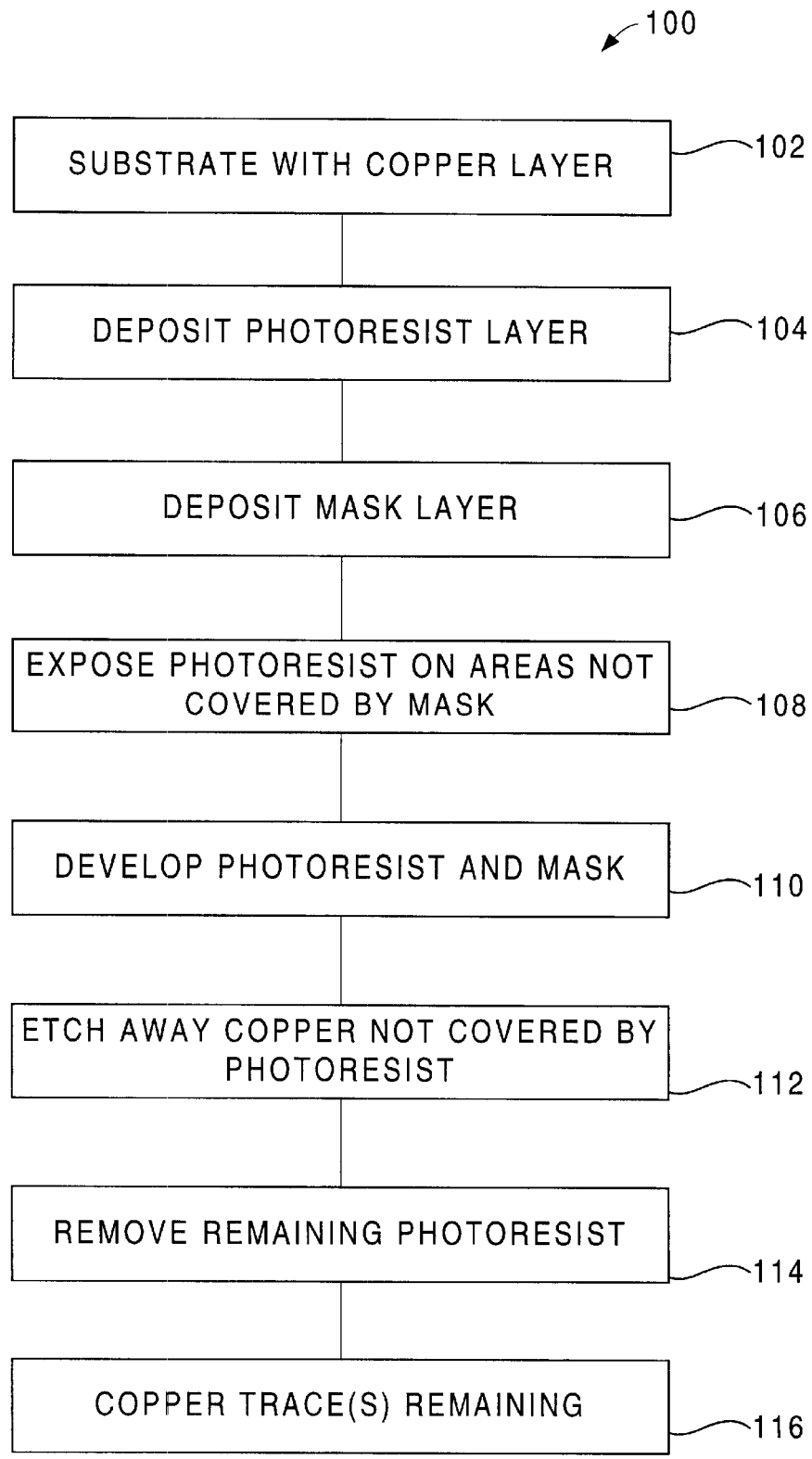
Prior Art Fig. 1

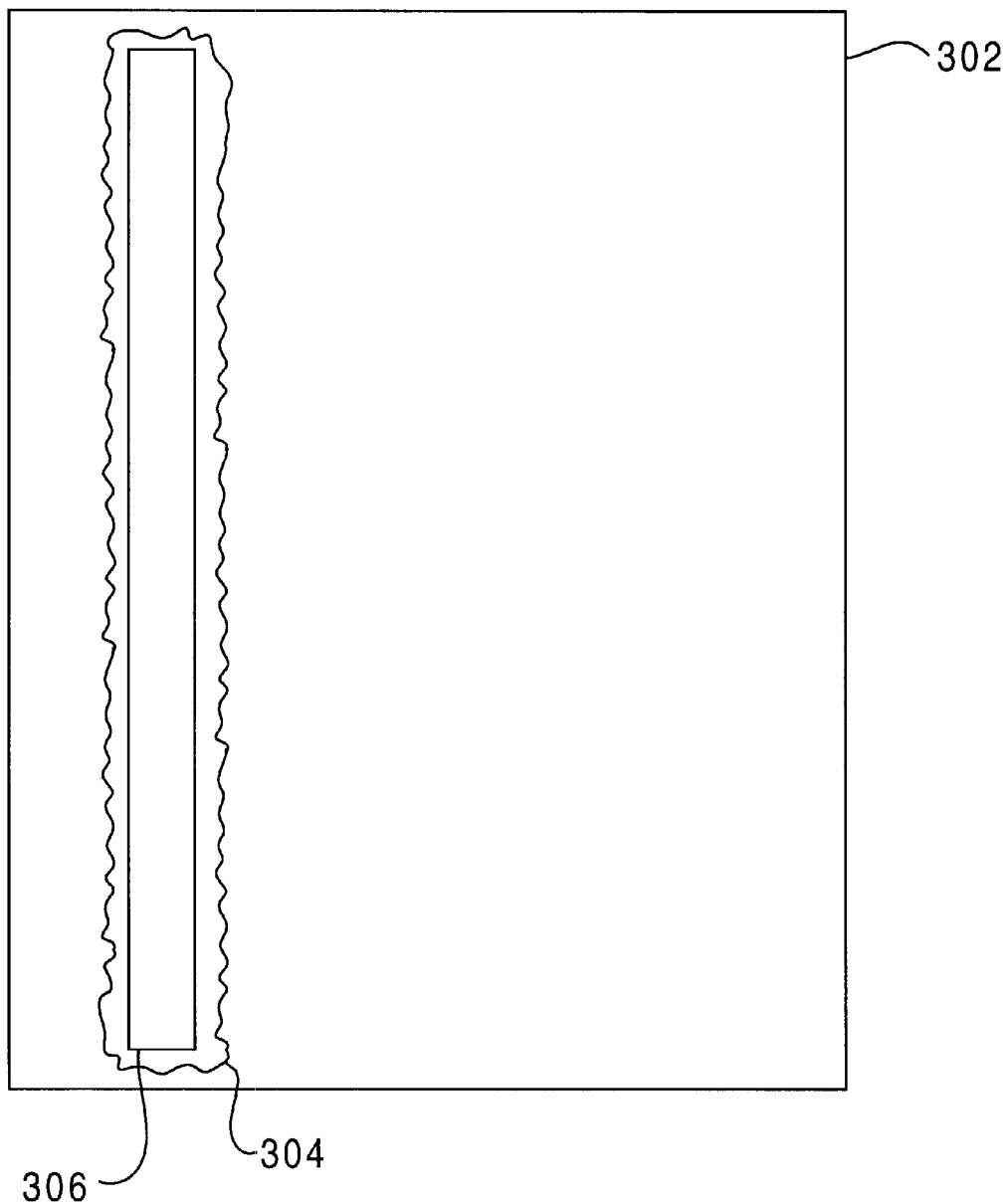
Prior Art Fig. 3

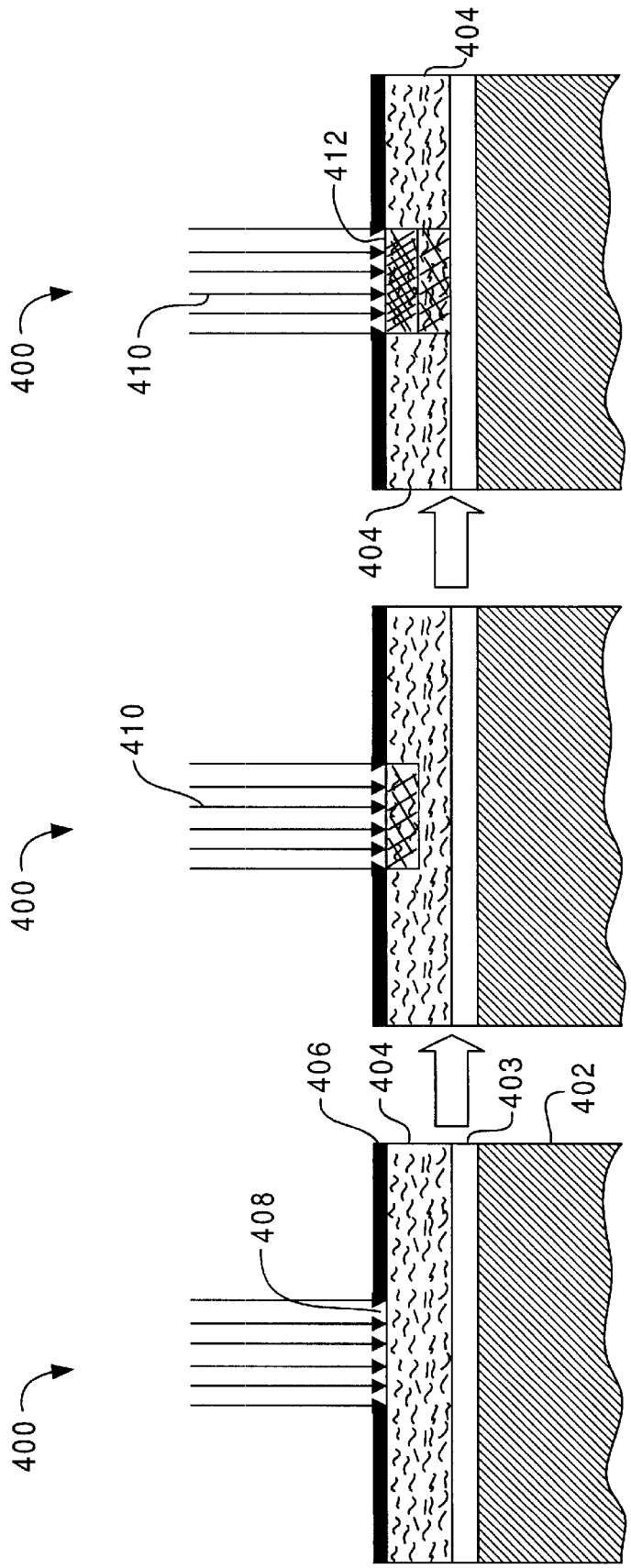

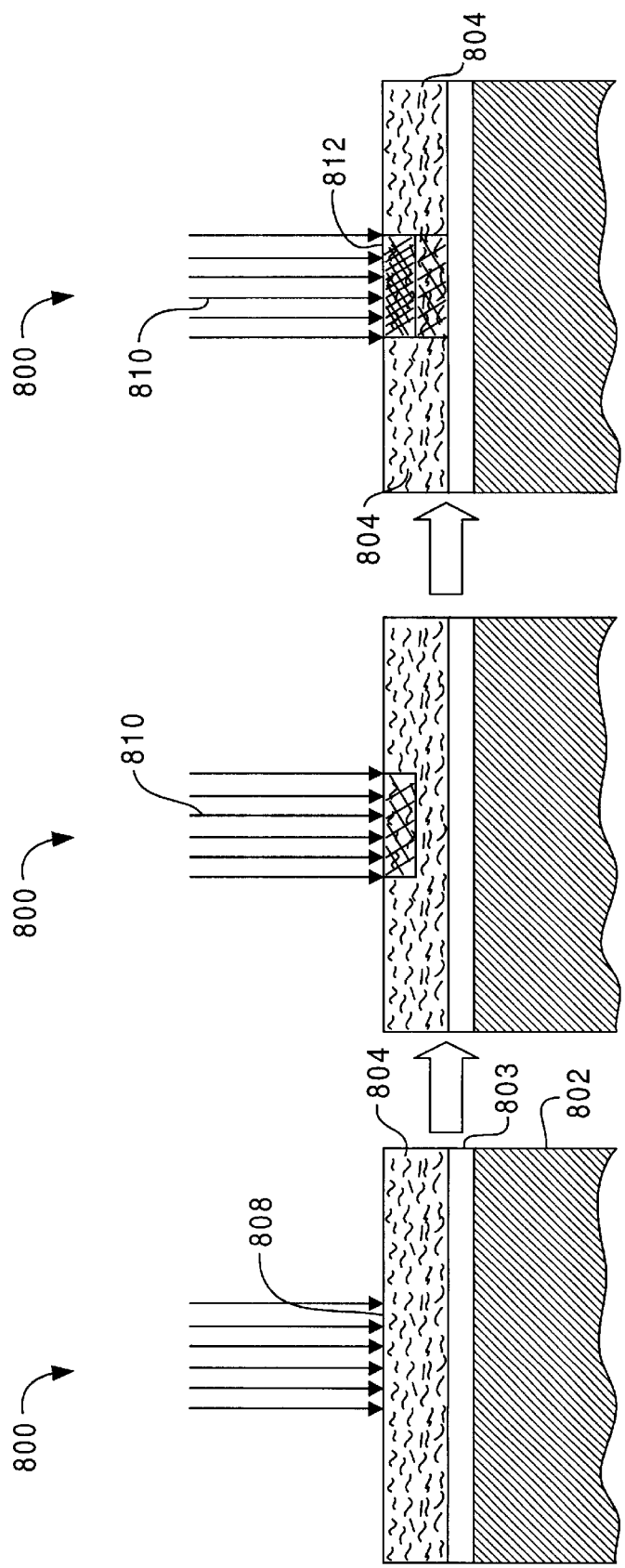

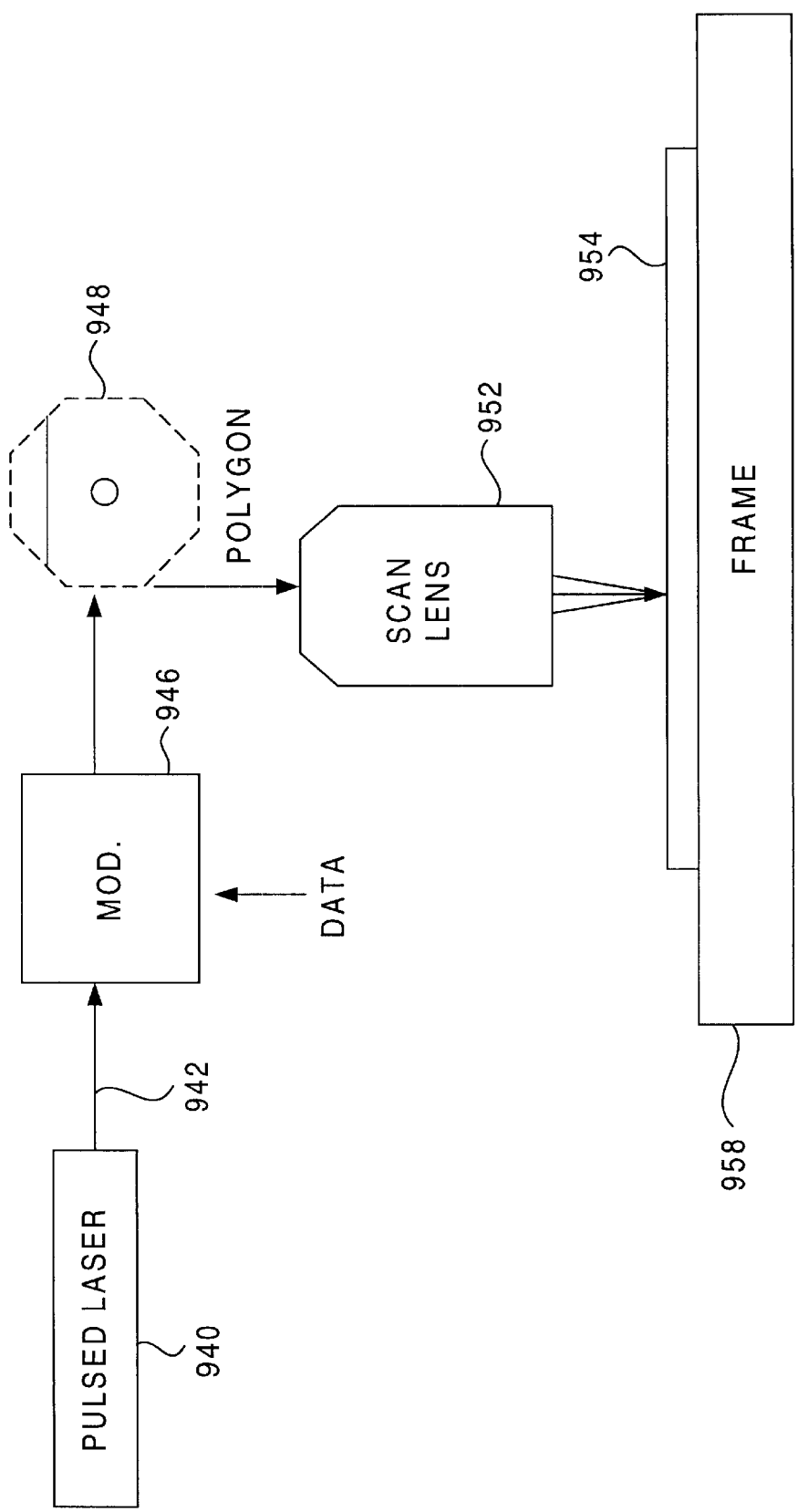

SYSTEM, METHOD AND ARTICLE OF MANUFACTURE FOR IMPROVED LASER DIRECT IMAGING A PRINTED CIRCUIT BOARD UTILIZING A MODE LOCKED LASER AND SCOPHONY OPERATION

BACKGROUND

The present invention relates to laser direct image printing and more specifically to a method and apparatus including a mode locked laser utilizing scophony methods to increase image quality and therefore line sharpness and accuracy.

It is known today that printed circuit boards may be composed of several PCB panels, each panel having two sides, one or more of which is provided with a layer forming an electrical circuit. When there is only one panel having only two layers, the board is commonly called a double-sided board or PCB panel, and when there are more than two layers, the board is commonly called a multi-layer board. A common way of manufacturing a multi-layer board is by fixing several panels together, each panel having a single printed circuit on one side, or a circuit on each side. "Outer" panels are those that face the outside of a multi-layer PCB, and "inner panels" are the interior panels. Typically, the inner panels have a circuit on both sides, while the outer panels have a circuit only on one, the outer side. Each inner panel resembles a thin double-sided PCB in that the panel is comprised of an insulating substrate, which is clad on both sides with metallic foil, typically copper foil. A printed circuit is formed on any circuit side of an inner panel by that side's metal cladding having a light-sensitive layer laid on top of the metal. The light-sensitive layer is exposed to light (typically ultra-violet (UV) radiation) at selected locations, then processed by a photographic process that removes the layer at selected locations. A metal etching process is then applied to remove those parts of the layer of metal not necessary for forming the actual circuit. Once all the double-sided inner panels are produced, they are fused (pressed) together by placing an insulating binding material, typically a partially cured epoxy-resin material called prepreg, between the panels. Unexposed outer foils are placed on the outside of the double-sided inner panels, again with prepreg in between. All the layers are now laminated by applying heat and pressure that causes the prepreg to flow and bond to the surfaces of the inner panels and the outer foils. Holes are now drilled on the laminated multi-layer board, including holes for mounting electrical components inserted into the board ("mounting holes"), and holes for making contacts from one layer to one or more other layers (feed-throughs, also called vias or conductive vias). The holes typically are plated through. Each outer side of the multi-layer panel now is sensitized, then exposed and processed to form the two outer printed circuits in exactly the same manner as forming circuits on the inner panels.

Since a multi-layer panel is exposed in the same way as an inner PCB panel, "PCB panel" or simply "panel" means either a complete PCB board, an inner PCB panel, or a post-lamination multi-layer panel.

A common method for producing printed circuit boards is to first produce artwork, which is an accurately scaled configuration used to produce a master pattern of a printed circuit, and is generally prepared at an enlarged scale using various width tapes and special shapes to represent conductors. The items of artwork, once reduced, for example, by a camera onto film to the correct final size, are referred to as phototools and are used as masks for exposing the sensitized layers. Because the photographic reduction is never 100 percent accurate, more accurate phototools are produced nowadays using photoplotters rather than photographic reduction.

However produced, physical phototools are susceptible to damage. In addition, whenever any amendments need to be made to any circuit, new phototools need to be produced. Furthermore phototools, sometimes in the form of photographic negatives, are difficult to store. They also may not be stable; their characteristics might change with temperature and humidity changes and can suffer degraded quality over time.

Many of the disadvantages of using phototools can be overcome by using direct imaging technology, for example with a laser direct imaging (LDI) device. The working and benefits of such LDI devices are known. LDI may be performed by scanning a laser across the surface of a PCB panel from one edge of the PCB panel to the other edge, along one or more scan lines. For examples of LDI systems and their use, see U.S. Pat. No. 5,895,581 to Grunwald (issued Apr. 20, 1999) entitled LASER IMAGING OF PRINTED CIRCUIT PATTERNS WITHOUT USING PHOTOTOOLS, and U.S. Pat. No. 5,328,811 to Brestel (issued Jul. 12, 1994) entitled METHOD OF PRINTING AN IMAGE ON A SUBSTRATE PARTICULARLY USEFUL FOR PRODUCING PRINTED CIRCUIT BOARDS. See also co-pending U.S. patent application Ser. No. 09/435,983 to Vernackt, et al. (filed: Nov. 8, 1999), entitled: METHOD AND DEVICE FOR EXPOSING BOTH SIDES OF A SHEET, assigned to the assignee of the present invention and incorporated herein by reference for all purposes.

One difficulty in producing multi-layered printed circuit boards is the strict requirement for accuracy in positioning the different PCB panels together to ensure that the different circuits are positioned very accurately relative to each other. In particular, the mounting holes and vias need to be very accurately placed on each layer's circuits. For a particular tolerance for the placement of a circuit, it is clear that any deviations in the specified location of the circuits on each of the layers may be additive, so that at any one location, there could be large deviations. For the case of double-sided panels, including the multi-layer panel after lamination, it is even more difficult to position the circuits accurately enough relative to each other.

Registration is the process of positioning the PCB pattern on the panel at a particular physical location. Thus, in the case of direct laser imaging, it is where the panel is physically positioned relative to the laser beam.

The relationship between imaging process and the registration process becomes increasingly important when higher geometrical accuracy higher PCB layout density are desired.

The geometrical accuracy can be increased by the use of a laser direct imaging (LDI) device. However, to achieve such benefits, both geometrical accuracy and the quality of imaging are important. In particular, the repeatability, line edge quality and control of the line width of the tracks after etching (i.e., the widths of the conducting interconnects) are important. Further, more and more circuit components such as coils, high frequency (HF) circuits, and oscillator circuits are nowadays being implemented within the PCB layout itself. It is necessary to predict the characteristics of those components, and for this, a known and controlled fabricating process is needed to substantially eliminate later circuit trimming. LDI technology addresses some of these problems and increase the overall imaging quality.

New technology for making PCB panels like sequential build up (SBU) and direct ablation of the copper can be used with direct imaging technology. Accuracy is also important for such new technologies that include adding each new layer directly to the previous stack of layers as an additive process. In such a case, the relationship between the imaging process and the registration process becomes very critical.

FIG. 1 illustrates one method of producing the PCB 200 illustrated in FIGS. 2A–2E. In block 102, a substrate 202 with a copper layer 203 is provided. Next, a layer of photoresist 204 is applied on top of the copper layer 203, in block 104. Then a mask layer 206 is placed on top oil the photoresist 204 in block 106. The mask layer has at least one opening 208 substantially corresponding to the location, shape and size of the desired copper trace 220. In block 108 the photoresist 204 that is not covered by the mask layer 206 is exposed with a high intensity light 210 such as an UV lamp. Next, in block 110, the mask layer 206 and the unexposed photoresist 204 is etched away. Then, the exposed portion of the copper layer 203 is etched away in block 112. The exposed photoresist 218 is then removed in block 114. In block 116, only the desired copper trace 220 remains.

When a direct imaging technology is used, step 106 is not used, and the mask layer 206 is not required. Step 108 is then replaced with a direct imaging step that exposes some areas of the photoresist and not others in accordance with imaging data that corresponds to the pattern desired.

As illustrated in FIGS. 2D and 2E, the exposed region of the photoresist 218 is typically wider at the bottom 224 than at the top 222, i.e., the sides of the exposed photoresist 218 are not perpendicular to the substrate 202. The top 222 is substantially the same width as the opening in the mask 208. The resulting copper trace 220 is similarly wider than the opening in the mask 208 (FIG. 2A). The triangular areas 214 and 216 represent an inaccuracy of the process 100. These areas 214, 216, while illustrated as having a triangular cross-section, are typically irregularly shaped, as known to those skilled in the art. FIG. 3 illustrates a PCB substrate 302 with an irregular trace 304 resulting from such inaccuracy, together with the opening in the mask 306 that corresponds to the desired trace.

As shown in FIG. 2E, the areas 214, 216 (shown triangular) are typically larger when non-collimated light source is used than when a collimated beam is used. If a perfectly collimated exposing light source is used, no error should, in theory, occur, assuming no other processes produce inaccuracies. A laser direct imaging (LDI) device approaches a near perfectly collimated light source but, as will be explained below, still does not eliminate the error-producing areas 214, 216.

The walls of any exposed resist area are called sidewalls herein. Sidewall quality degradation contributes to line edge quality degradation. Other causes of sidewall quality degradation in addition to non-perfect collimation are present when phototools (and other masks) are used. One reason is that the light must travel through a certain transparent layer 205, causing the light to be at least slightly diffracted by the diffraction coefficient of the transparent layer 205. Since LDI devices do not use such phototools or a transparent layer, this diffraction error is eliminated and thus inherently increases the quality.

There thus are advantages to directly imaging the required circuit patterns onto PCB panels, for example PCB panels that include a light-sensitive layer on one or both sides. Directly imaging PCB panels in particular improves geometrical position, provides collimated exposure, and eliminates diffraction-related errors. Note that the same advantages also are provided when directly imaging printing plates that include a UV, visible light, or thermally-sensitive layer.

Often such sensitive sheets as used for PCBs or thermal printing plates are rigid, so that the scanning apparatus for exposing such sheets for direct imaging (e.g., directly exposing printing plates or directly exposing PCB panels) is of the flat-bed type in which the sheet is disposed on a horizontal table for exposure by the light energy (e.g., UV light or infrared) produced by the scanner. Such scanning apparatuses are typically quite bulky because of the horizontal table. Also, such direct imaging systems expose one side at a time, and there are problems accurately aligning the two sides for double-sided exposure. Above referenced and incorporated herein by reference co-pending U.S. patent application Ser. No. 09/435,983 to Vernackt, et al., describes a LDI device that images two sides of a panel that is held vertically, and including relatively positioning the imaging beams of one side to the other.

Note that direct imaging in itself does not ensure proper alignment of the real PCB panel to be processed with other panels, especially with outer layers where the image has to match the drilled holes pattern. A linked registration-imaging engine may be used to ensure such proper alignment. In addition, automatic handling of PCB panels is desirable, and a modem LDI device may include such an automatic material handler. The manufacturing difficulties of precise alignment and handling described above are further amplified as the overall physical size of the PCB panel increases. A PCB panel can be up to 24 inches wide and up to 36 inches long (609.6 mm×914.4 mm). Even larger PCB panels are known to be used. An automatic material handling system for a LDI device that is described in U.S. patent application Ser. No. 09/511,646 to Vernackt (filed Feb. 22, 2000) entitled A SYSTEM, METHOD AND ARTICLE OF MANUFACTURE FOR DIRECT IMAGE PROCESSING OF PRINTED CIRCUIT BOARDS, and assigned to the assignee of the present invention.

Typically PCB panels to be direct imaged are coated with a photoresist material (photoresist). The photoresist can be any one of several materials well known in the art, for example Riston® Photoresist (E. I. du Pont de Nemours and Company, Research Triangle Park, N.C.) or Laminar® Photoresist (Morton Electronic Materials, Tustin, Calif.). In the industry it is believed that for a given photoresist, a given quantity of light energy E must be imparted to the photoresist to properly and completely expose or react the photoresist. This has been expressed in the form of a product of power of the light source and exposure time as expressed in Equation 1:

$$E = I \times t \qquad \text{Equation 1}$$

Where:
  I=intensity of the UV light (mW/cm$^2$)
  t=time of exposure (seconds)
  E=energy (mJ/cm$^2$)
  1W=1 J/s Direct imaging typically uses a laser as the source of exposing energy. Several types of lasers may be suitable as a laser light source for exposing photoresist in a direct imaging process. A commonly used laser is a continuous wave (CW) ultraviolet (UV) laser having a relatively low power of 1 to 4 watts. Such lasers are typically UV gas-ion lasers, and are available front, for example, Coherent, Inc., Santa Clara, Calif., and Spectra-Physics Lasers, Inc. Mountain View, Calif. Also solid state UV CW lasers are currently being developed. These also have relatively low laser power.

With the relatively low laser energy level that such lasers provide, extended exposure times are required to impart :he required level of power to the photoresist. This extended exposure time results in increased manufacturing time, among other shortfalls. Furthermore, due to one or more effects such as chemical migration of the exposed photoresist, using a relatively low power laser over an extended exposure time results in the formation of the inaccuracy-producing areas 214, 216 in the sides of the photoresist. The resulting PCB traces are then inaccurately shaped.

As geometries of the copper trace 220 become ever smaller, and the PCB panel becomes ever more crowded with traces and components, accuracy becomes extremely important.

As explained above, LDI has simplified the process of PCB exposure by eliminating the mask layer 206 and providing for increased accuracy in the manufacturing process. However, the lasers typically used still produce undesirable inaccuracies.

Furthermore, LDI devices typically use some modulation device to modulate the light pattern along a scan line. Such devices have a finite rise (and fall) time, so that the light beams cannot be turned on or off instantaneously. This too leads to loss of perpendicularity of sidewalls of exposed photoresist, with resulting resolution degradation and inaccuracies.

Thus there is a need for an method and apparatus to reduce the exposure time, increase the perpendicularity of the walls of exposed resist areas, increase the accuracy of placement of the sidewalls, increase the accuracy of the beginning and the end of an exposed photoresist line, and increase the accuracy of the resulting PCB trace.

SUMMARY OF THE INVENTION

A system, method and article of manufacture is disclosed that provides an improved, higher efficiency, more accurate laser direct imaging on a photosensitive medium on a substrate using a mode-locked laser having a low average power and a short pulse width. The mode-locked laser is scanned across the surface of the photosensitive medium. The resulting in-scan edges having improved perpendicularity relative to the underlying substrate.

Another embodiment, describes a method for laser direct imaging a pixel on a photosensitive medium with a laser beam. The method comprises providing a substrate having a first surface and an opposing second surface, and a photosensitive layer on the first surface. Then, emitting a mode locked laser beam, then receiving the laser beam by an acousto-optical modulator. Then receiving a modulating signal in the acousto-optical modulator and modulating the laser beam in the acousto-optical modulator. Next, emitting a modulated laser beam from the acousto-optical modulator to a first scanner unit. The scanner unit then receives the modulated laser beam and then directs the modulated laser beam across said first photosensitive layer in an in-scan direction to cause a first pixel of the first photosensitive layer to substantially photo-polymerize. The first pixel is defined by a surface area contacted by the modulated, pulsed laser beam and substantially penetrating through the first photosensitive layer to the first intermediate layer. The first pixel has a first side and a first' in the in-scan direction and a first beginning and a first end in the cross scan direction, the first side and the first' side being substantially perpendicular to the substrate.

Yet another alternative embodiment is a laser direct imaging apparatus for imaging a pixel on a photosensitive medium with a laser beam. The apparatus comprises a substrate, the substrate including a first surface and an opposing second surface and a first photosensitive layer on the first surface. The apparatus also comprises a mode locked laser operable to emit a pulsed laser beam and an acousto-optical modulator. The acousto-optical modulator includes a crystal oriented to receive the pulsed laser beam and a transducer. The transducer is in contact with the crystal and the transducer receives a modulating signal from an external source and then emits the modulating signal into the crystal to modulate the pulsed laser beam. The apparatus also includes a first scanner unit oriented to receive the modulated, pulsed laser beam. The first scanner unit directs the modulated, pulsed laser beam across the first photosensitive layer in an in-scan direction to cause a first pixel of the first photosensitive layer to substantially photo-polymerize. The first pixel is defined by a surface area contacted by the modulated, pulsed laser beam and substantially penetrating through the first photosensitive layer to the substrate. The first pixel has a first and first' sides in the in-scan direction and a first beginning and a first end in the cross scan direction. The first side and first' side are substantially perpendicular to the substrate.

In an alternative embodiment, the mode-locked laser is a ultraviolet (UV) laser, having a wave length of between 200 nm and 532 nm.

In an alternative embodiment, the mode-locked laser is modulated in a scophony mode. The resulting cross scan beginning and end of the scanned line has improved perpendicularity relative to the underlying substrate. The improved perpendicularity resulting in improved accuracy over the prior art.

In an alternative embodiment, the disclosed ultraviolet, mode-locked, scophony mode modulated laser is included in a dual side laser direct imaging system, method and apparatus wherein the substrate has a photosensitive medium on a first surface and on a second, opposing surface and the photosensitive medium on both sides of the substrate are substantially simultaneously imaged or scanned.

In an alternative embodiment the substrate is held in a frame which can be moved in a cross scan direction. The frame allows the substrate to be moved in a cross scan direction so that the ultraviolet, mode-locked, modulated laser can be caused to scan across the entire surface of the photosensitive medium.

The disclosed, improved, ultraviolet, mode-locked, scophony-mode-modulated laser imaging system, method and apparatus provides improved efficiency of up to a factor of three. This allows usage of a low, average power laser while still providing improved accuracy.

BRIEF DESCRIPTION OF THE FIGURES

FIG. 1 illustrates a flow chart of a prior art photo-lithographic process.

FIG. 3 illustrates a trace created by a prior art photo-lithographic process.

FIGS. 4A–4D illustrate a substrate undergoing a photo-lithographic process in accordance with one embodiment of the present invention.

FIGS. 8A–8D illustrate a substrate undergoing a photo-lithographic process in accordance with one embodiment of the present invention.

FIG. 9 illustrates one embodiment of a mode locked laser system in accordance with the present invention.

DETAILED DESCRIPTION OF THE INVENTION

Figures 2A, 2B, 2C:
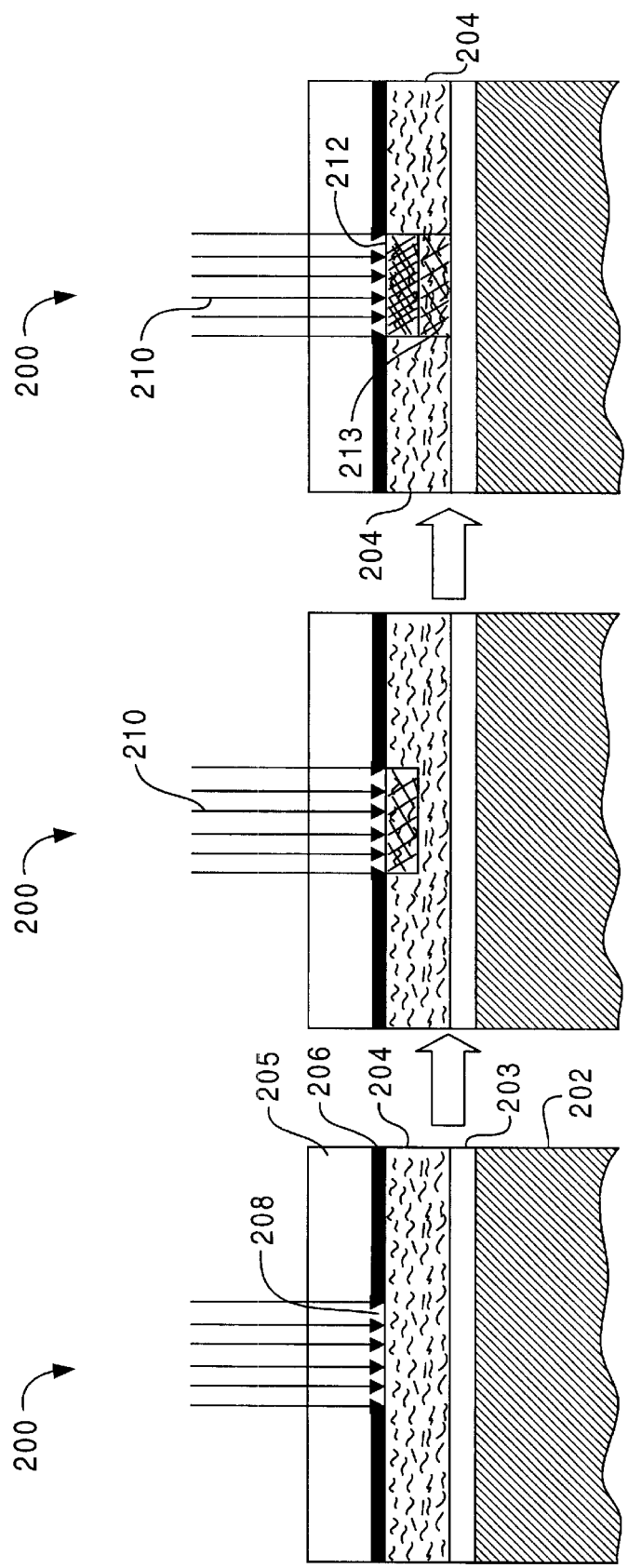
FIGS. 2A–2E illustrate a substrate undergoing a prior art photo-lithographic process.
Figures 2D, 2E:
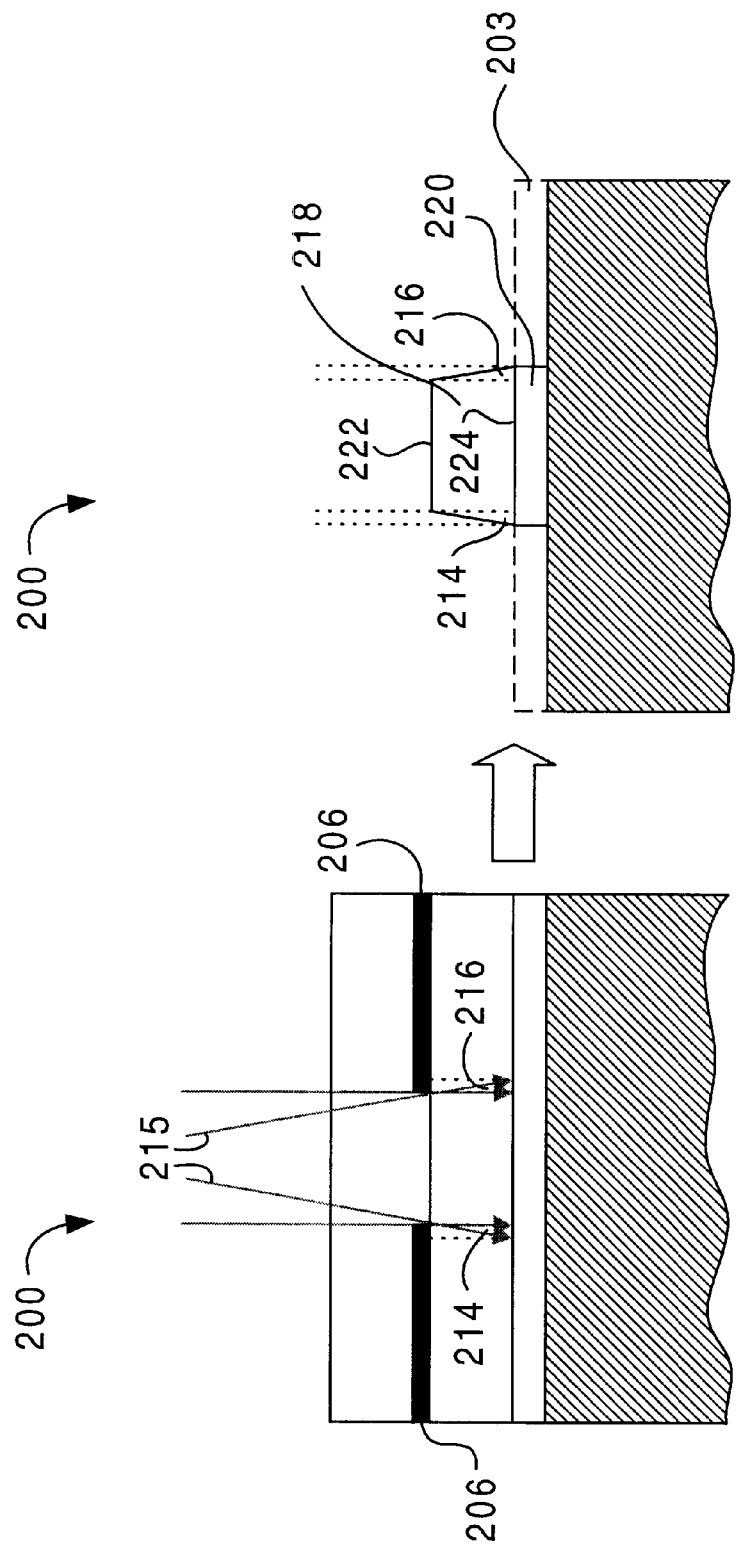

As illustrated in FIG. 2E, the exposed photoresist 218 is wider at the bottom 224 than at the top 222, i.e., the sides of the exposed photoresist 218 are not perpendicular to the substrate 202. The top 222 is substantially the same width as the opening in the mask 208. The resulting copper trace 220 is similarly wider than the opening in the mask 208. The triangular-shaped areas 214, 216 represent an inaccuracy of the process 100. These triangular areas 214, 216, while illustrated in triangular form, those skilled in the art know can also be irregularly shaped. The formation of the triangular, inaccurate areas 214, 216, shown in FIG. 2, in the sides of the photoresist are caused by a combination of two factors.

The first cause is the chemical migration of the exposed photoresist into the unexposed photoresist areas. Chemical migration is simply the process of a high concentration of a chemical migrating into a lower concentration area. The photosensitive resist consists of different chemical components such as photo initiators, inhibitors, polymeric binder, thermal inhibitors and other chemicals. Exposing the photoresist with a known quantity of energy such as heat or light of the proper wavelength causes the photoresist to polymerize, this is also known as photo-polymerization. Photo-polymerization is a process by which the photoresist photosensitive monomers are "chained" together into polymers. This process results in polymer chains that form a strong fabric-like structure in the exposed area. The strong fabric-like structure is capable of resisting the attack of the development or etching chemistry and later chemical steps.

Photoresist materials are most sensitive or reactive to specific, ideal wavelengths of energy. Typically, a photoresist that is sensitive to ultraviolet (UV) light is used. If a given photoresist is most sensitive to a particular, ideal UV wavelength, then the UV light source must be centered on the same ideal wavelength to achieve the highest speed of exposure. UV of a wavelength not centered on the ideal wavelength can typically initiate the exposure process, but typically at a reduced rate, therefore requiring additional time to achieve the same results as an equivalent UV source centered at the ideal wavelength for that photoresist.

When UV contacts the photosensitive photoresist, the inhibitors are destroyed and the photo-polymerization begins. The speed of photo-polymerization through the whole thickness of the photoresist depends on the amount of UV energy available. The process starts from the top surface and proceeds towards the bottom of the photoresist as illustrated in FIGS. 2A–2C. The exposure process is believed to be a photo-polymerization process that creates a high concentration of polymer chains in the center, directly exposed areas 212, 213. The concentration of polymer chains chemically migrates into areas of the photoresist 204 to either side of the directly exposed areas 212, 213 having less concentrations of the polymer chains. This chemical migration causes the triangular, inaccurate areas 214, 216 shown in FIG. 2E. Of course the detailed working of the photoresist process is beyond the scope of this text and is a well known process for those skilled in the art of chemical processes.

A second cause of the formation of the roughly triangular cross-section, inaccuracy-producing areas 214, 216 in the sides of the photoresist 204 is when the exposing light enters the photoresist 204 at some angle other than perpendicular to the substrate 202. This is also known to occur even when collimated light sources are utilized. As shown in FIG. 2D, the exposing light rays 215 enter the photoresist 204 at an angle different from perpendicular to the substrate 202 and thereby undercut the mask layer 206 and expose the photoresist 204 to either side of the opening 208 in the mask 206. This under cutting of the mask layer 206 occurs especially when the UV lamp light source is used in combination with a phototool mask. This error is also called "under-radiation effect". LDI technology improves this process and thus provides for increased line edge quality during imaging and later resist/copper development.

The undesirable effect of inaccuracies and errors such as triangular areas 214, 216 are magnified when multiple follow-on processes use similar error-prone processes to those that produce the inaccuracies in the previous step/process. Additional design effort and additional geometric space are required to counteract this inaccuracy trend.

FIGS. 4A–4D illustrate one embodiment of the present invention of producing a PCB 400 using a phototool. A substrate 402 with a conductive layer 403 is provided. The conductive layer 403 can be copper, aluminum or other conductive material. Next, a layer of photoresist 404 is applied on top of the conductive layer 403. Then a mask layer 406 is placed on top of the photoresist 404. The mask layer 406 has at least one opening 408 substantially corresponding to the location, shape and size of the desired copper trace 420. The mask layer 406 can also be in the form a reticle or other means of masking light in a photo-lithographic process, and such reticles and means are known to one skilled in the art. The photoresist 404 that is not covered by the mask layer 406 is exposed with a UV, mode locked laser light 410. The mask layer 406 and the unexposed photoresist 404 is etched away. Then, the portion of the copper layer 403, which is no longer covered by photoresist 404, is etched away. The exposed photoresist 418 is then removed. Only the desired copper trace 420 remains.

Figure 4D:
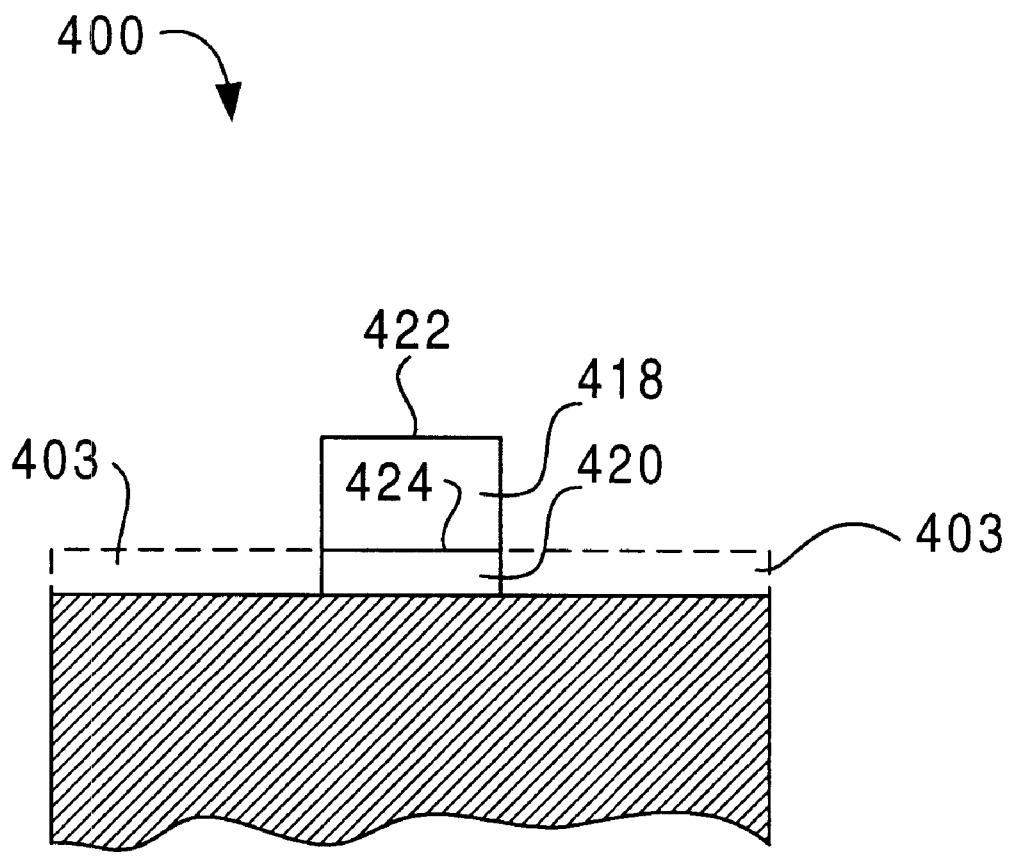
Figure 5:
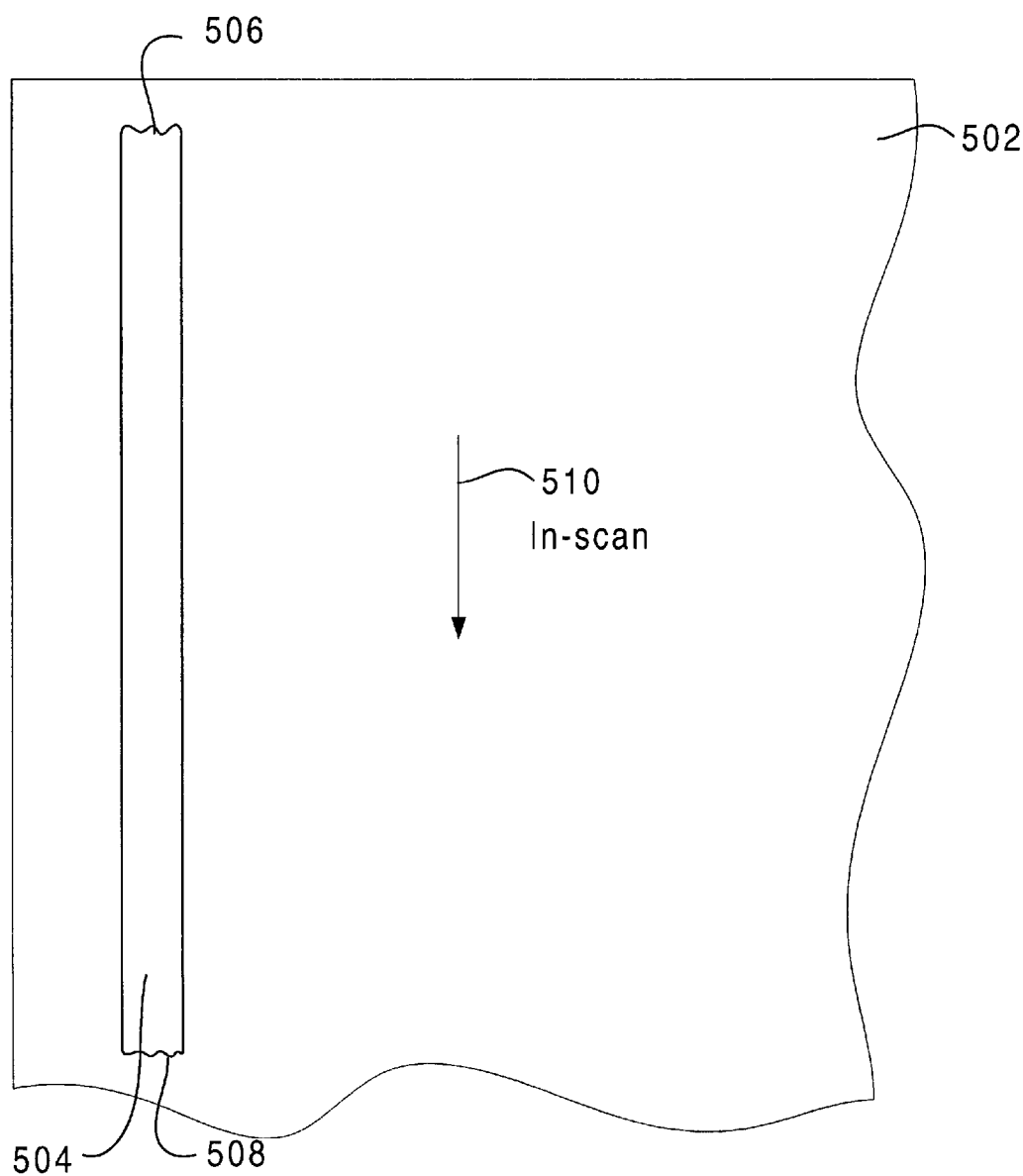
FIG. 5 illustrates a trace created by a photo-lithographic process in accordance with one embodiment of the present invention.

As illustrated in FIG. 4D, the exposed photoresist 418 the bottom 424 is substantially the same width as the top 422, i.e., the sides of the exposed photoresist 418 are substantially perpendicular to the substrate 402. The top 422 is substantially the same width as the opening in the mask 408. The desired copper trace 420 is similarly substantially the same width as the opening in the mask 408. FIG. 5 illustrates a PCB substrate 502 with the trace 504, which is substantially the same as the opening in the mask (not shown).

Figure 6:
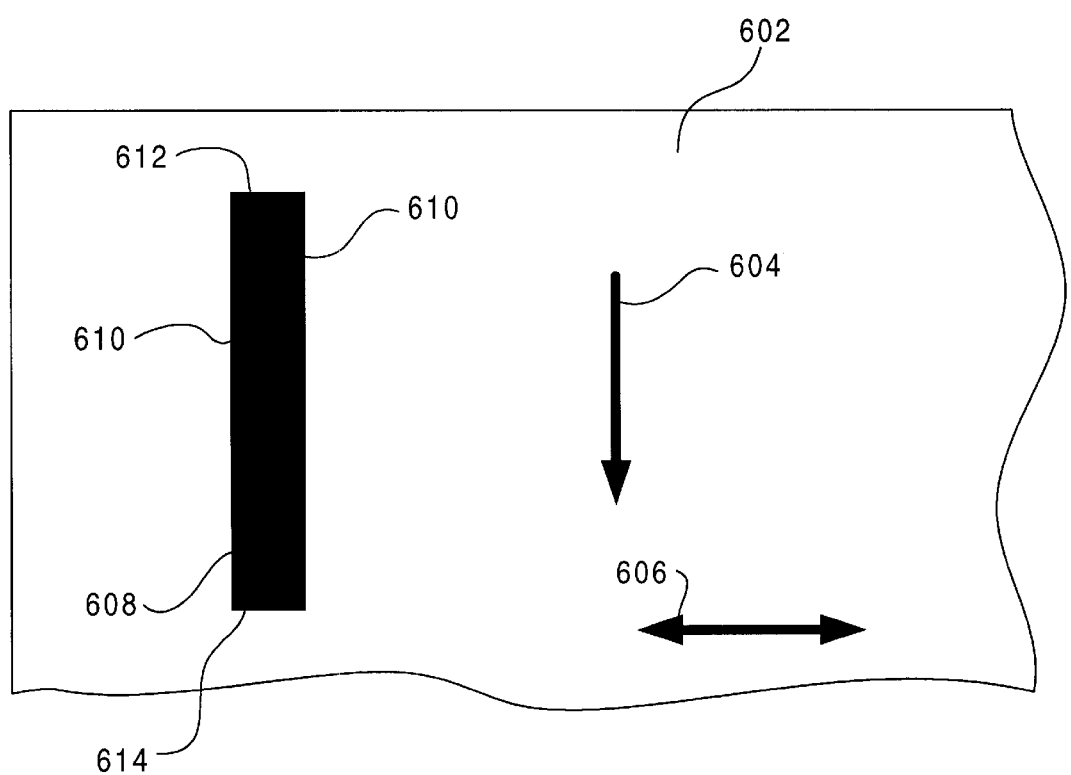
FIG. 6 illustrates the relative directions on a photosensitive panel to be submitted to a photo-lithographic process.

Using a mode locked laser improves the side perpendicularity and therefore the side accuracy or quality in the in-scan direction. The in-scan direction is the direction the laser scans the surface being scanned as shown in FIG. 6. Equation 1 provides: E=I×t and that E is constant for a certain photoresist sensitivity. So if the I (intensity) is low then a longer exposure time t is required, to theoretically achieve the same result. In actual tests, a longer time t results in poor edge quality due to photo-polymerization migration on the side-walls of the exposed photoresist, as described above. Therefore, a short exposure time is more desirable, which in turn requires a higher power (higher intensity "I") laser source.

A mode locked laser is a special type of laser. In one embodiment, the mode locked laser is mode locking at 80 MHz with a pulse width of 10 ps. This means that the pulse has a width of 10 ps and a pulse is generated every 12.5 nanoseconds. The mode locked laser used has an average power of 5 Watts.

$$\frac{\text{average power} \times \text{pulse frequency}}{\text{pulse width}} = \text{Peak Power} \quad \text{Equation 2}$$

Using the example mode locked laser above, Equation 2 provides:

$$\frac{(5 \text{ W}) \times (12.5 \text{ ns})}{10 \text{ ps}} = 600 \text{ Watts Peak Power}$$

The resulting peak power is very high. Using such a mode locked laser, we found that the exposure time is significantly reduced. Furthermore, the laser has a high (peak) power (or intensity) to average power (or intensity) ratio, and a high average power. Using such a laser results in substantially perpendicular sidewalls in the in-scan direction as illustrated in FIGS. 4A–4D, which in turn leads to higher accuracy in the direction perpendicular to the in-scan direction.

Actual tests using such an UV mode locked laser identified yet another advantage. The unexpected result is that the efficiency of the exposure of the photosensitive media is improved by a factor of approximately three or more from what would be expected, for example, from what would be expected using a prior art continuous wave (CW) laser. This efficiency allows use of a UV mode locked laser with ⅓ or less of the required average power of a prior art CW laser. This improvement of efficiency by an approximate factor of three was not predicted by the accepted formula as expressed in Equation 1. For example:

Recall:

$$E=I\times t \quad \text{Equation 1}$$

Where:
I=intensity of the UV light (mW/cm$^2$)
t=time of exposure (seconds)
E=energy (mJ/cm$^2$)
1W=1 J/s Using Equation 1, a CW laser having a 355 nm wavelength and 50 mW average power would require 4.875 seconds to expose an area of 3.75 cm$^2$ of photoresist "A" having a resist sensitivity of 65 mJ/cm$^2$.

An experiment was performed using a 80 MHz mode locked laser having a 355 nm wavelength and an average power of 50 mW. This required only 1.2 seconds to expose the same 3.75 cm$^2$ area of photoresist "A".

This result illustrates a factor of improvement of approximately four over the use of a continuous wave (CW) laser having the same average power. This improvement was not predicted by the accepted relationship illustrated in Equation 1. In addition, the mode locked laser yielded improvements in perpendicularity and accuracy, as described elsewhere herein.

This unexpected result further reduces the required laser average power or allows for further reduced exposure time or combinations thereof, as compared to a conventional CW laser. A lower power, mode-locked laser can also be more economically manufactured than a higher powered mode-locked laser. Therefore, using a mode locked laser having a lower average power such as 50 mW to 4 watts results in a combination of inherent efficiency improvements and edge accuracy and perpendicularity is improvements as compared to a similarly powered CW laser. Other mode locked lasers having higher average power, such as up to 20 watts may also be utilized. Further extrapolation of the test results show that if the laser has a wavelength of between 200 nm and 532 nm, a pulse width of between 1 ps and 20 ps, pulse frequency of between 50 MHz and 400 MHz, and a duty cycle between 125 to 1 at 400 MHz and 20,000 to 1 at 50 MHz, then the efficiency of exposing a pixel is increased by a factor of 2.5 or more over use of a continuous wave laser of similar power and wavelength.

Yet another advantage of a mode locked laser of a conventional CW laser of the same power and wavelength, is that a mode locked laser can more rapidly expose a given photoresist even if the mode locked laser is not emitting light at the ideal wavelength for the photoresist. This allows a mode locked laser to expose a broader variety of photoresist materials than a similar power and wavelength CW laser. Therefore a mode locked laser is more versatile and fewer individual mode locked lasers, where each laser is centered at a different wavelength, are required to expose various photoresist materials having ideal wavelengths distributed across the spectrum. This decreases complexity in the number of mode locked lasers required and increases the flexibility of each, individual mode locked laser. This greater versatility and reduced complexity further reduces the cost of a laser imaging device utilizing a mode locked laser.

Consider now a LDI device which scans a surface line by line. Such an LDI device is described in above referenced and incorporated herein by reference co-pending U.S. patent application Ser. No. 09/435,983 to Vernackt, et al. A laser is scanned in the in-scan direction, and produces a set of scan lines separated by a small distance in the direction substantially perpendicular to the scan-line direction (called the transverse, cross scan, or slow scan direction). FIG. 6 illustrates a single segment 608 of a laser scan line being written on a substrate 602 coated with photoresist. By a scan line segment such as segment 608 we mean part of a scan line starting from one point at which the beam modulation changes to another point at which the beam modulation changes. Segment 608 might, for example, represent a single pixel, in which case those in the art will appreciate that segment 608 is shown having an exaggerated length. The start 612 of the scan line segment 608 might be where the beam is turned on from an off state, or in the case of "gray scale" modulation, a point at which the beam changes from one level to another. Similarly, the end 614 of the scan line segment 608 might be where the beam is switched off or changes from one level to another. The in-scan direction 604 is illustrated by an arrow pointing down. The in-scan direction 604 is the direction in which the laser scan moves very fast over the substrate or media or surface to be scanned and is determined by the polygon speed in the optical system. In an alternative embodiment, the in-scan direction could be upwards. In still another embodiment, the laser could scan in both upwards and downwards directions and therefore the in-scan direction would be both upwards and downwards. The cross scan direction is illustrated by an arrow 606 pointing both left and right. In alternative embodiments, the cross scan direction could be only to the left or only to the right. The beginning 612 of the scan line segment 608 is where the laser scan begins the scan line segment 608. The end 614 of the scan line segment 608 is where the laser scan ends the scan line segment. The quality, accuracy and perpendicularity of the in-scan edges 610, or side walls, in the in-scan direction 604 are substantially improved by use of the mode locked laser. The quality, accuracy and perpendicularity of the beginning 612 and the end 614 is determined by several factors, including the speed of modulating (e.g., turning -on and turning off) the laser light during scanning.

Figure 7:
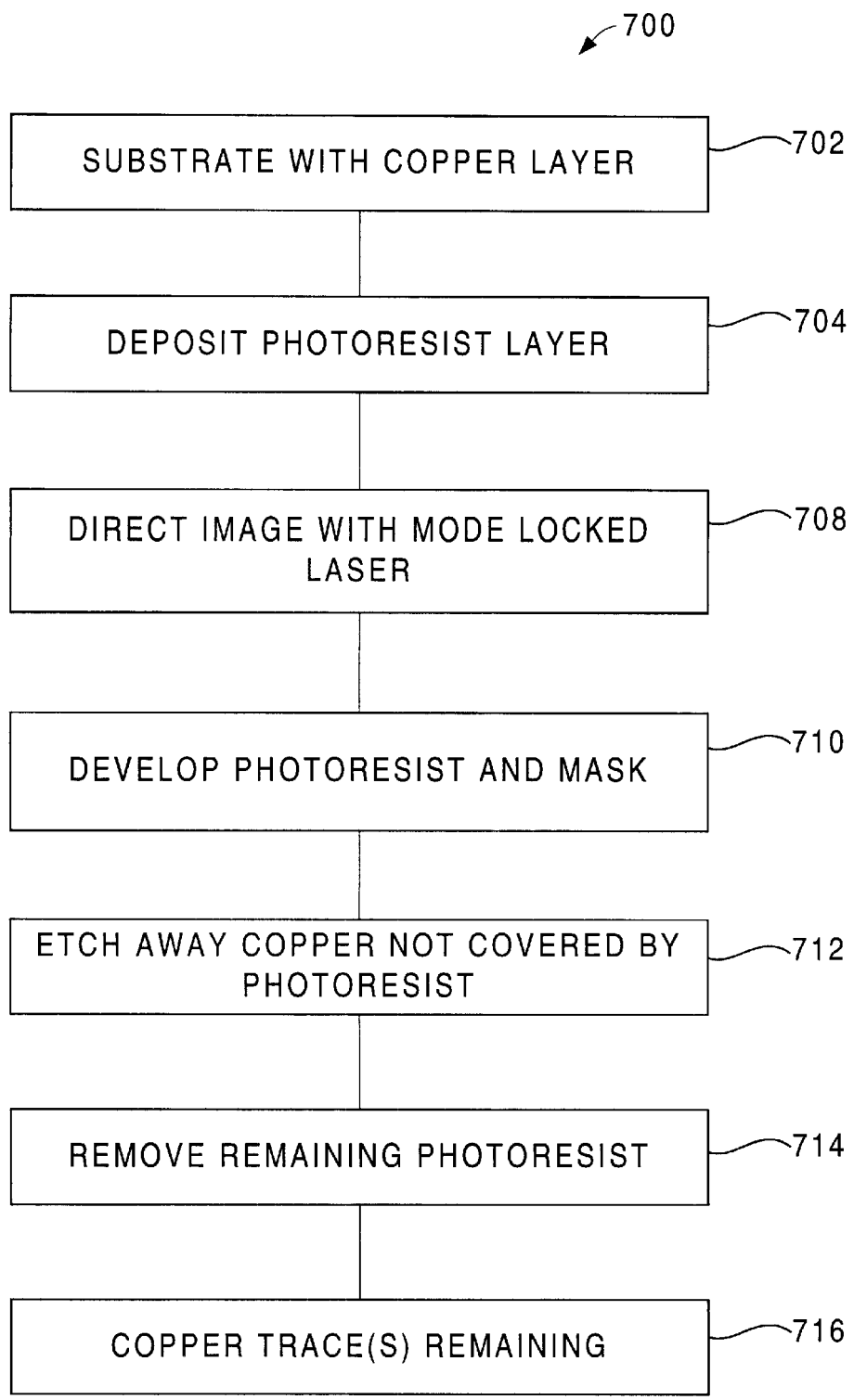
FIG. 7 illustrates a flow chart of a photo-lithographic process in accordance with one embodiment of the present invention.

FIG. 7 illustrates a laser direct imaging (LDI) process using the mode-locked laser to produce the PCB 800 illustrated in FIGS. 8A–8D. In block 702, a substrate 802 with a copper layer 803 is provided. One skilled in the art would know other aluminum and other conductive materials could be used instead of copper. Next, a layer of photoresist 804 is applied on top of the copper layer 803, in block 704. The photoresist layer 804 can be applied in any of a plurality of methods or combinations known in the art. In block 708 the photoresist 804 is selectively exposed with a mode-locked laser. Note that since this is a LDI, no mask or reticle is used but rather the laser scans or writes the desired image directly on the photosensitive surface. Next, in block 710, the photoresist 804 is being developed, removing portions of resist according the imaging pattern. As known to those skilled in the art, there are both positive and negative working photoresist. Then, the non protected portion of the copper layer 803 is etched away in block 712. The remaining photoresist 818 is then removed in block 714. In block 716, only the desired copper trace 820 remains.

Figure 8D:
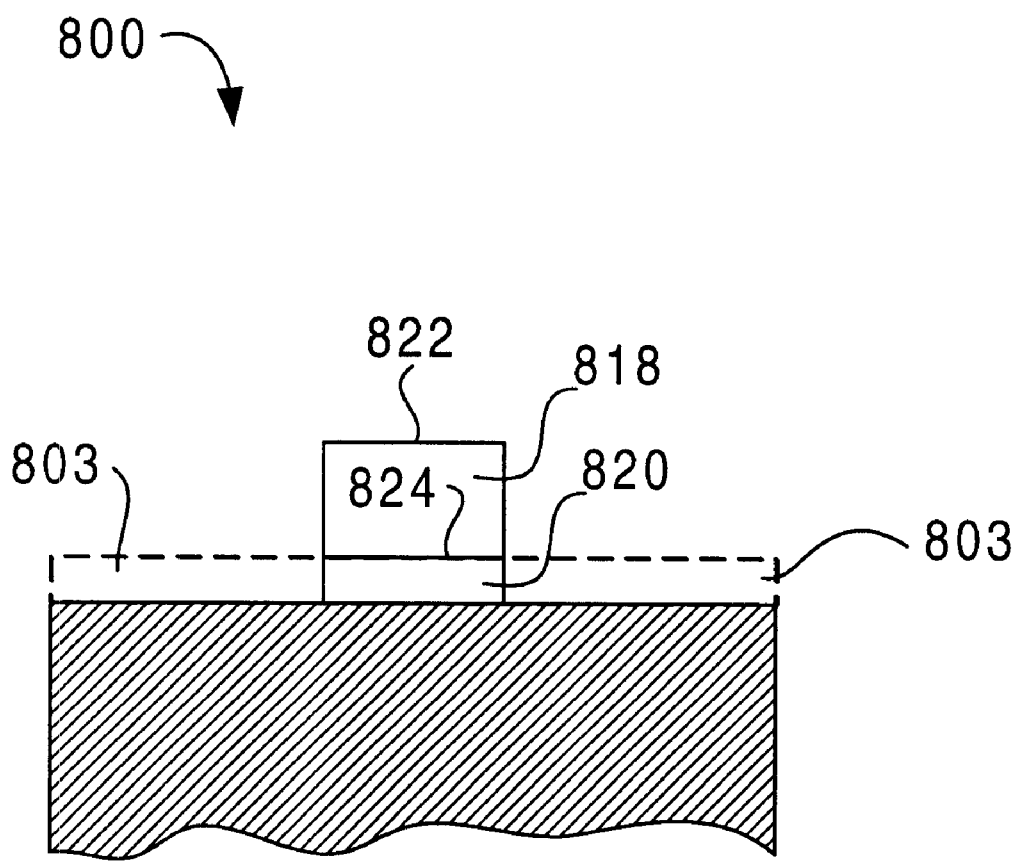

As illustrated in FIG. 8D, the exposed photoresist 818 the bottom 824 is substantially the same width as the top 822, i.e., the sides of the exposed photoresist 818 are substantially straight and perpendicular to the substrate 802. LDI exposures using a pulsed laser in accordance with one aspect of the present invention make those sidewalls perpendicular to the substrate 802 when those sidewalls are in the laser in-scan direction. Furthermore, using scophony mode for the LDI exposures in accordance with another aspect of the present invention make those sidewalls perpendicular to the substrate 802 in other directions, so that the preferred embodiment provides for having substantially perpendicular sidewalls in all directions. When FIG. 8 shows the cross-section of a PCB trace which is in the in-scan direction, the top 822 is substantially the same width as the width covered by the one or more scan-lines from the laser. The desired copper trace 820 is similarly substantially the same width as the one or more scan-lines from the laser. The LDI method reduces the tendency of the exposing light entering the photoresist at some angle other than perpendicular to the substrate 802. The mode lock laser used in the LDI method further reduces the tendency of the exposing light entering the photoresist at some angle other than perpendicular to the substrate 802. The low duty cycle, i.e., the high peak power and short time duration pulse of the laser light from the mode lock laser used in the LDI also reduces the time available for photo-polymerization and chemical migration to occur. The mode lock laser thereby improves the perpendicularity, accuracy and quality of the side walls of the photoresist.

The substantially perpendicular edges of the photoresist provide sharp, controlled line widths in copper after the chemical etching process. A certain thickness of the photoresist is required during the chemical etching to provide sufficient protection against the chemicals. By "Substantially perpendicular edges" and "substantially perpendicular to the substrate" is meant having side walls that are substantially perpendicular to the substrate's surface after processing the PCB such that the resolution is improved in the direction perpendicular to the side wall, as illustrated in FIG. 8, the improvement being over having less perpendicular side walls such as illustrated in prior art FIGS. 2A–2E. Similarly, by having "improved perpendicularity" is meant having side walls that are more perpendicular to the substrate's surface after processing the PCB such that the resolution is improved in the direction perpendicular to the side wall over the prior art.

A simplified diagram of a laser pattern generator in accordance with one embodiment of the present invention is illustrated in FIG. 9. This laser pattern generator, in terms of most of its components, is conventional and is also similar to a variety of commercially available laser pattern generators as used for photolithography. However, this laser pattern generator includes, instead of a conventional CW laser, a pulsed laser 940, which emits a series of laser pulses indicated as laser beam 942 which is pulsed at a relatively high frequency, i.e., 100 MHz with a range of typically 1 to 400 MHz. Such a laser can be constructed from a mode-locked Nd:YLF laser driving an external cavity that is resonant for second harmonic radiation. This approach to laser construction has been described, for instance, in S. C. Tidwell, J. F. Seamans, D. D. Lowenthal, G. Matone and G. Giordano, "Efficient High-Power UV Generation by Use of a Resonant Range Driven by a CW Mode-Locked IR Laser," Optics Letters (Sep. 15, 1993). A commercially available model of such a laser is the Antares Nd:YLF model from Coherent, Inc. Adapting such a laser to operate with a resonant cavity is well within the skill of one of ordinary skill in the art. It is to be understood that a pulsed laser is most advantageous at shorter wavelengths, where CW operation at high power levels is not possible. Other advantages of pulsed lasers are their small size and high electrical efficiency.

We are having made for us a mode locked laser with an average power of 5 W with a locking frequency of 80 MHz and a pulse width of 12 ps, for use in one preferred embodiment. We built one alternate embodiment of the invention with an earlier version of the laser that achieved 1 W average power and another alternate embodiment with another early laser version that achieved 4.5 W average power.

In various alternative embodiments, the mode locked laser can have a wavelength of between 200 nm and 532 nm, a pulse width of between 1 ps and 20 ps, a pulse frequency of between 50 MHz and 400 MHz, an average power of between 50 mW and 20 watts and an average duty cycle of between 125 to 1 and 20,000 to 1, where the duty cycle is defined as the ratio of time between pulses to pulse width.

The pulsed laser beam 942 is coupled to the optical input port of an acousto-optic modulator (AOM) 946, which, as shown, also has an electrical port receiving a data signal in the form of pixel data. This data signal represents the pattern to be written. It is to be understood that the laser beam 942 may be split into a number of sub-beams and the modulator 946 may actually be one channel of a multi-channel modulator, with each channel individually modulating each of the sub-beams, as is well known in this field. Alternatively, several modulators may be used, with each modulating a single beam. The modulated beam output from AOM 946 is incident upon the reflective facets of a conventional rotating polygon 948 of the type well known in this field. The polygon 948 is the actual scanning device and is part of the scanning optics.

Other types of scanners may also be used. For example, acousto-optical deflection may be used to generate the scanning motion of the beam. An acousto-optical scanner hence is substitutable for a polygon-type scanner and was found to be faster at short scans. Hence while FIG. 9 shows the rotating polygon scanning device 948, an acousto-optical or other deflection device can be substituted. Many other types of scanner technology exists and are not in the scope of this text, but known to those skilled in the art.

The scanning laser beam, reflected from the facets of rotating polygon 948, passes through the scan lens 952 which typically includes refractive (and sometimes reflective) optics which focus the beam on the upper surface of work piece or media or substrate 954, which in turn is held on frame 958. The work-piece is for example a panel such as a substrate 954 having a layer of metal to be patterned and over which is also formed a photoresist layer to be exposed by the scanning beam. Commercially available photoresist for PCB's are exposed by an approximately 355 nm wavelength laser beam. An example of such photoresist is Riston® Photoresist (E. I. du Pont de Nemours and Company, Research Triangle Park, N.C.). Typically the modulator 946 is optimized for the 355 nm wavelength region in terms of transducer geometry and acoustic coupling. Similarly, the refractive elements of the scan lens 952, using conventional fused silica and if necessary, quartz lens elements, are optimized for the particular incident wavelength. Such modifications are well within the skill of one of ordinary skill in the art. A typical optical output power level of laser 940 is 1 Watt. Hence, a system of the type depicted in FIG. 9 operating with a shorter wavelength (e.g. 266 nm or less) pulsed laser also is within the scope of this invention. Of course, accompanying changes are required to the modulator and the scan lens to accommodate the shorter wavelength as well as a suitable resist; such changes are within the skill of one of ordinary skill in the art. Photoresist exposed by 266 nm are an active field of investigation with many approaches under consideration; preliminary results have been demonstrated.

As described above, the apparatus of FIG. 9 takes one of at least two embodiments. In the first embodiment the pixels, i.e., the data applied to the electrical port of modulator 946, are synchronous to the pulse rate of the laser. It is to be understood that the pulse rate of the laser is a fixed frequency dependent on the actual laser cavity design and materials. The laser pulses in one embodiment are 5 ps long and have a period of 1 nanosecond (ns). The pulse rate is 50 to 100 MHz. This is only exemplary and other wavelengths are possible for the laser as are other pulse lengths and periods (pulse frequencies) that provide the high peak to average ratio.

Figure 10:
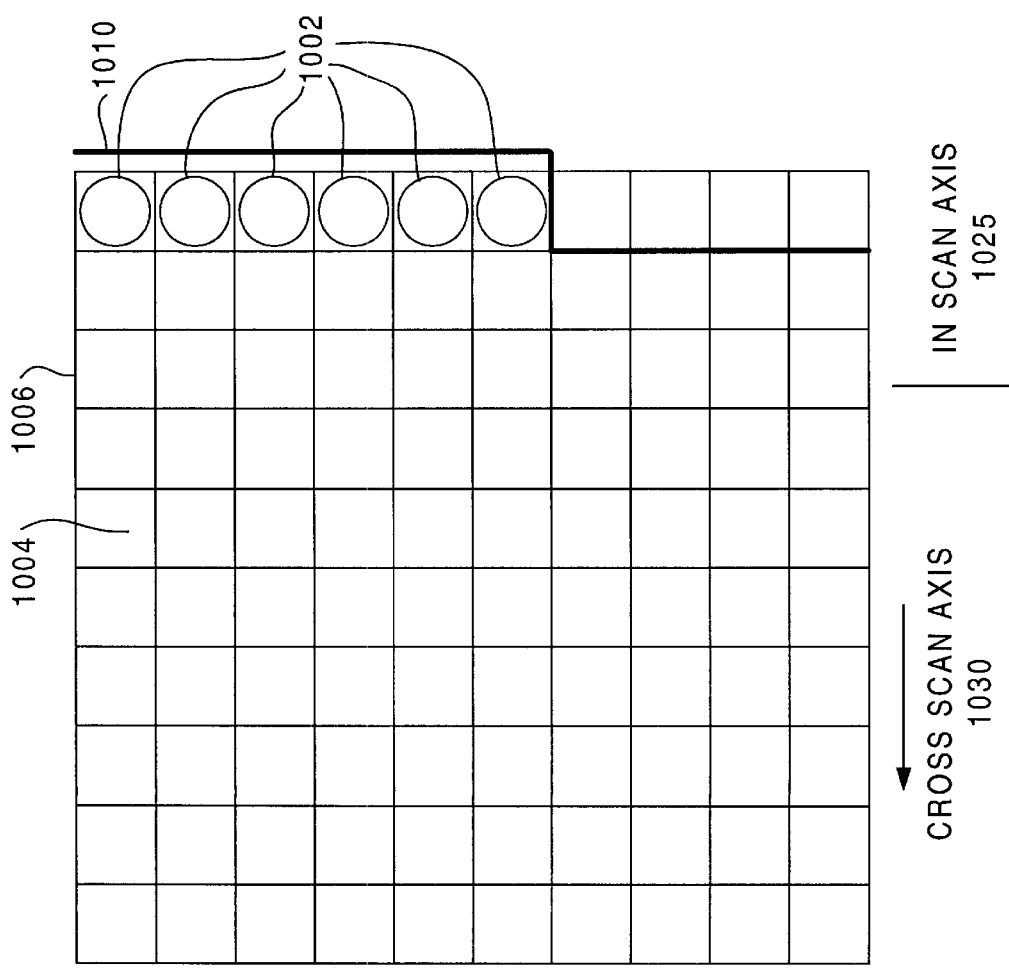
FIG. 10 illustrates a laser scan diagram.

FIG. 10 shows an example of a pattern scanned by such a synchronous mode laser scanner. The edge position of the feature being written (shown by the circles 1002 which are intended to be exposed beam spots or pixels) represents the feature edge position determined by a fixed writing grid 1004 and the modulator state, i.e., on, off, grayscale, at the edge pixels. Grayscale (variations in image intensity between on and off) can also be used. In this case, the individual spots, i.e., exposed pixels, are formed in a sequence by laser pulses on the fixed writing grid formed by the laser beam being modulated by the modulator according to the pixel data. The in-scan axis 1025 is the vertical axis and the cross scan axis 1030 is the axis of movement is the horizontal axis. The pixels 1002 being on or off represent an edge of the feature, shown by line 1010.

Figure 11:
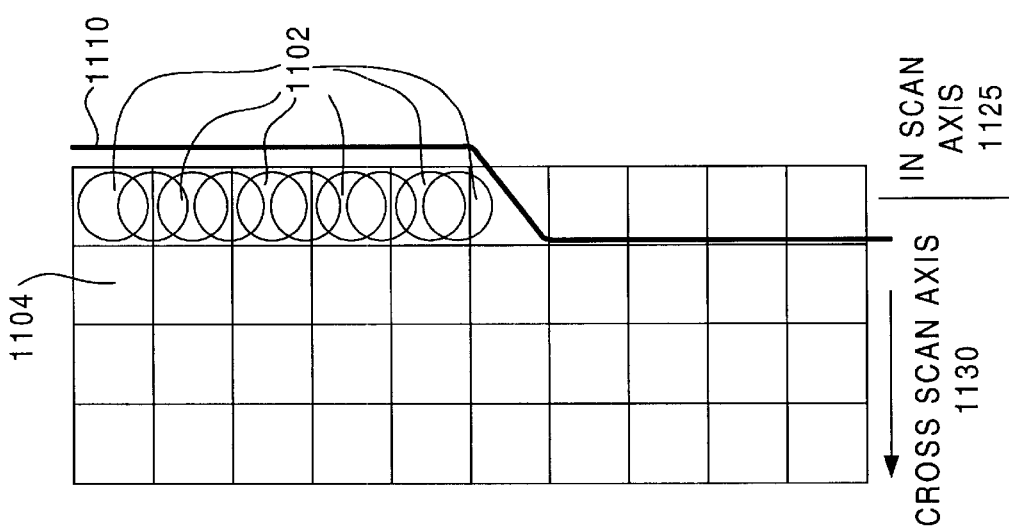
FIG. 11 illustrates another laser scan diagram.

FIG. 11 shows writing in an asynchronous mode embodiment. In this case, the individual pixel spots 1102 are not aligned to the writing grid 1104, but are turned on or off by the modulator 946 typically more gradually than the laser pulse rate, in order to achieve the writing pattern shown in FIG. 10. The modulator intensity profile determines the feature edge position, shown by line 1110. This embodiment also can be used in conjunction with grayscale, but again grayscale is not necessary. Here the laser pulse rate is e.g. 200 MHz. One common specification for both embodiments is that the pulse rate of the laser must be at least the same or higher than the pulse rate of the pixel data.

In addition to the sides of each laser scan line being inaccurate, the beginning and the end of each scan line or scan line segment are also typically inaccurate, similar to the side walls. The inaccuracies in the beginning and end of each scan line or scan line segment are caused by different causes than the inaccuracies of the side walls. The beginning and end of each scan line segment is inaccurate as a result of a relatively slow turn on sequence of the laser at the beginning of each scan line segment and a relatively slow turn off sequence at the end of each scan line segment. This slow turn on and turn off sequence results in a sloped turn-on or turn-off power of the laser at the start and end of each scan line segment. One method to solve improve the turn-on and turn-off of the laser, i.e., higher speed switching of the laser, and thereby improve the accuracy, perpendicularity and quality of the beginning and end of each scan line segment is to scan in "scophony" mode. Scophony mode scanning substantially eliminates the rise time effect on the media of the AOM. As will be described in detail below, one result of using scophony mode is that the laser modulation turn on/turn off profile substantially resembles a step function in time, rather that a function in time that has some finite slope. One example of scophony mode laser switching is described in U.S. Pat. No. 4,213, 158 to DeBenedictis. Another is described in U.S. Pat. No. 5,923,359 to Montgomery. Both U.S. Pat. Nos. 4,213,158 and 5,923,359 are incorporated herein by reference for all purposes.

The finite rise (and fall) times of the modulator also may lead to inaccuracies of features within a scan line, for example, at pixel boundaries. This is particularly important when the scanner is operated in asynchronous mode.

As described above, in the preferred embodiment, an AOM is used as an active light switch to modulate the laser beam on or off according to the pixel data. An AOM provides a certain slope where the light energy increases from zero deflection to maximum deflection over a certain time. If the laser pulse arrives, for example, in the middle of that slope, the laser energy directed towards the photosensitive media is limited. Limiting the laser energy reduces the benefits of the mode-locked laser described above. Also in a scanning device, the actual instantaneous location or spot where the laser is focused on the media, is caused to move or scan across the media very quickly. This quick scan across the surface results in the laser energy being distributed over a larger area than it would be if the spot focused on a single location for an extended time. In other words, this means that for the same energy, a larger area has been exposed, and therefore less laser power intensity per unit area. This causes the end and beginning of the scan line segment to have reduced accuracy, perpendicularity and quality (more fuzzy). An example of a reduced accuracy beginning 506 and end 508 of each trace or scan line segment is illustrated in FIG. 5.

Scophony mode substantially instantly applies the full available laser power to the photosensitive surface. This instant on substantially improves accuracy, perpendicularity and quality of the end and beginning of the scan line segment.

Figure 12B:
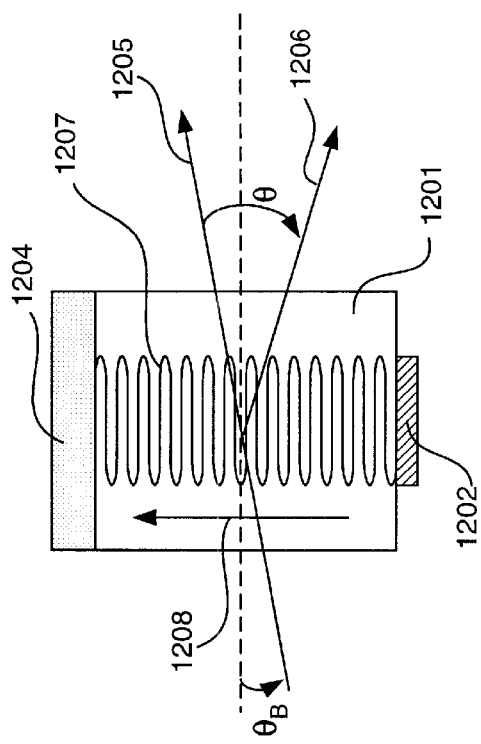
FIGS. 12A–12B illustrate an AOM in accordance with one embodiment of the present invention.
Figure 12A:
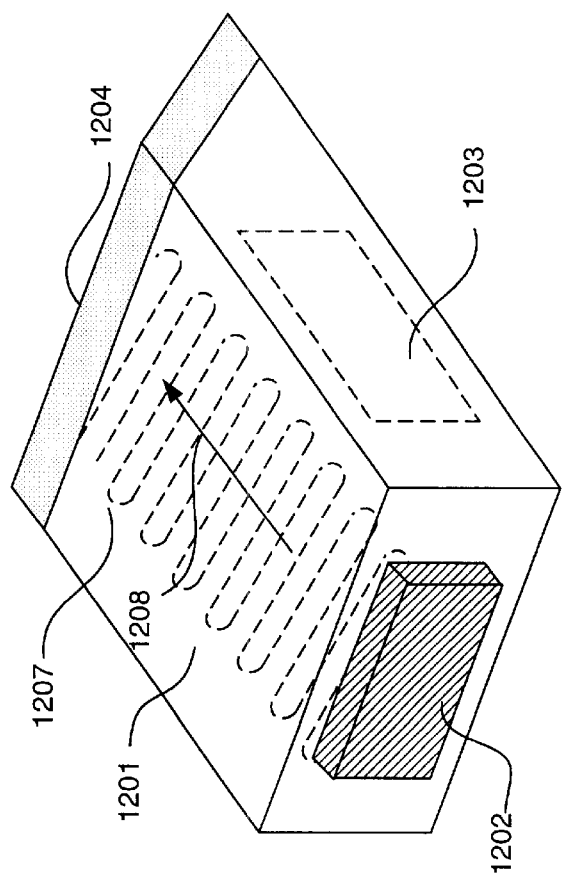

FIGS. 12A–12B illustrate the principle of operating an AOM. 1201 is an AOM crystal. 1202 is a RF transducer attached to the AOM crystal 1201. 1203 is the active window of the AOM crystal 1201 where laser light/RF sound interaction occurs. 1204 is an absorbing surface to reduce RF back reflections inside the AOM crystal 1201. 1205 is the zero order diffracted beam exiting the AOM and 1206 is the first order diffracted beam exiting the AOM. 1207 is the acoustic wave inside the crystal travelling in the acoustic wave direction 1208. The first order beam 1206 is used for imaging. The first order beam 1206 beam is turned on (i.e., the main beam deflected to generate the first order beam) or not according to the pixel data applied to the RF transducer. The pixel data is transformed into wavefronts within the AOM that move at an acoustic speed 1207 within the AOM. This results in an image on the imaging surface, e.g., on the surface of a PCB panel, that moves at a velocity related to the magnification of the optical system of the laser beam between the AOM and the surface of the panel being imaged, and to the acoustic speed within the AOM. In scophony mode imaging, the image of the acoustic wave is oriented to move parallel and in an opposite direction to the scanning laser beam. Furthermore, the velocity of the scanning laser beam is made equal to the velocity of the image of acoustic wave on the imaging surface. In this way, the imaging data is effectively "frozen" onto the surface of the panel being imaged even though the laser beam is being moved in the in-scan direction. Thus, the rise and fall time effects are significantly reduced. It is as if the switch has a block wave characteristic. The pixel data appears to be effectively standing still on the media.

In one embodiment of the present invention a mode-locked laser is combined with scophony mode to create improved edge quality in both in-scan direction (sides) and cross scan direction (beginning and end) of each scan line segment—which may be a single pixel—during one exposing event.

Figure 13B:
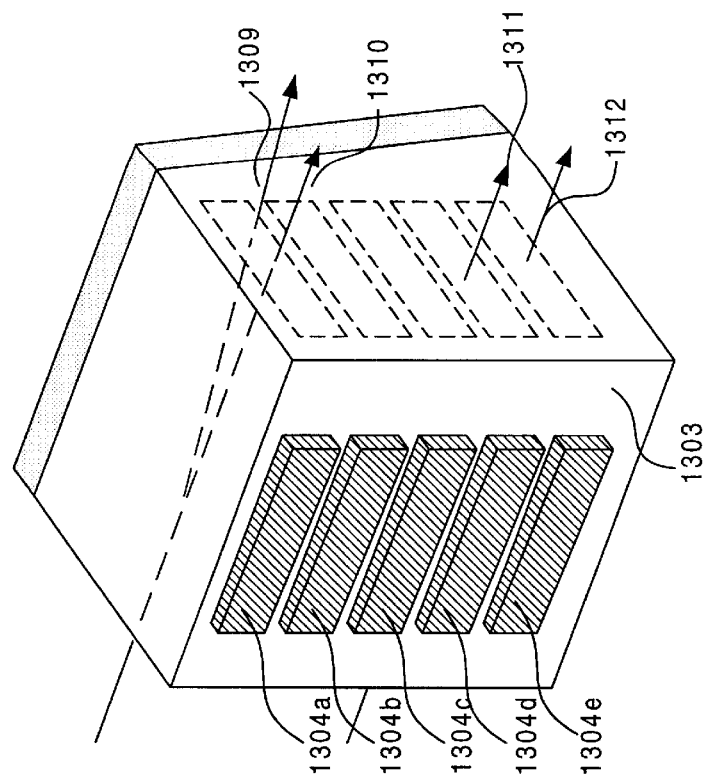
FIG. 13B illustrates an AOM in accordance with one embodiment of the present invention.
Figure 13A:
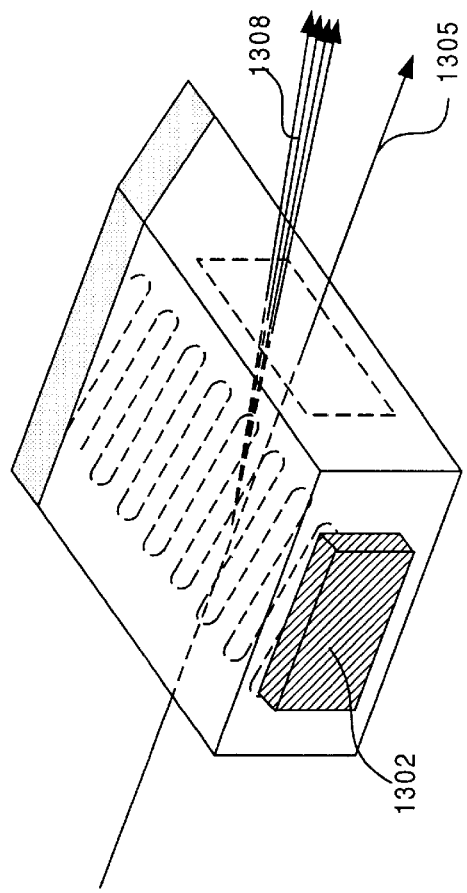
FIG. 13A illustrates an AOM in accordance with one embodiment of the present invention.

AOM devices are used to switch the laser light on/off going towards a laser sensitive medium as described above. AOM devices can be configured as a monobeam or multibeam. These multiple configurations provide the ability to write pixels, and thereby create an image, on media. An example of such multibeam devices are shown in FIGS. 13A–B. Multibeam technology improves the throughput of a LDI device.

A mono crystal/transducer version is illustrated in FIG. 13A and includes the undeflected original (and also the zero order exit) laser beam 1305. The original laser beam 1305 is deflected by a mixed RF signal applied to the transducer to generate a plurality of deflected beams 1308 that are each used for imaging. Each of the components of the mixed RF signals modulates the particular deflected beam. Alternatively, a stacked transducer with one crystal configuration is possible as shown in FIG. 13B. Several original beams are used, coming from different laser sources or from a beam splitter (not shown). One such beam is shown as 1310. Each beam is deflected or not, and one deflected beam 1310 is shown, and is generated if transducer 1304a is activated with a RF signal. Similarly, other beams (e.g., original beams 1311 and 1312) are deflected according to whether or not their respective transducers 1304b–1304e are activated with a RF signal. The RF signal is modulated according to the pixel data, and comes from an RF driver/amplifier (not shown).

An LDI in accordance with one embodiment of the present invention situation uses one laser source, two optical heads and a head to head laser switch. This creates an optical multiplexing system. The head-to-head switching can be performed on one active laser beam, this is a mono beam version, or on a group of multiple number of beams, this is a multi beam configuration. An AOM can also be utilized to perform the head to head switching.

Figure 14:
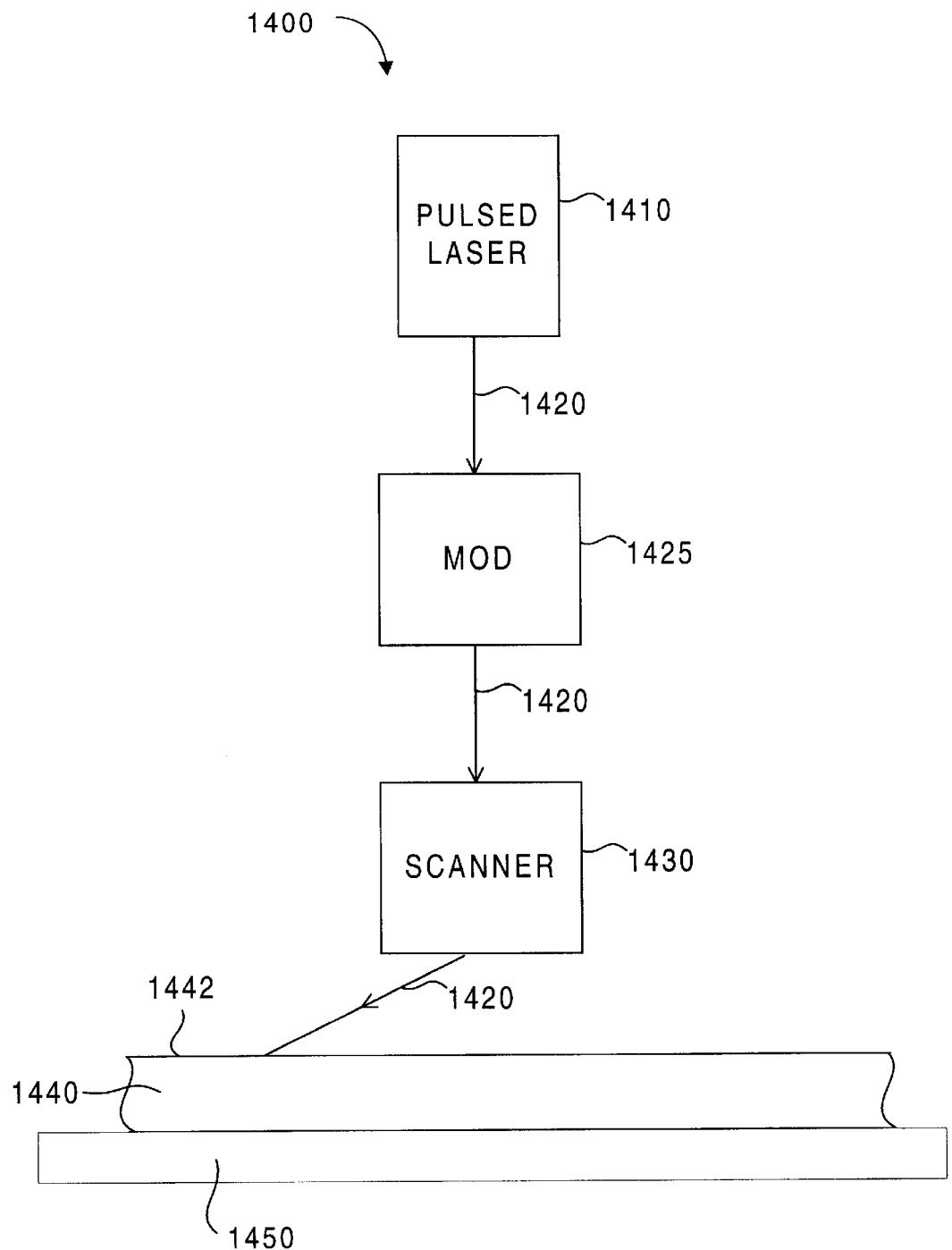
FIG. 14 illustrates a laser direct imaging (LDI) device in accordance with one embodiment of the present invention.

As shown schematically in FIG. 14, in one embodiment, a light source 1410 is used for generating a light beam 1420. Light source 1410 of exposing apparatus 1400 includes a mode locked UV laser, as described above, generating a main beam 1420 which is directed to optical scanning unit 1430. Optical switch 1425 acting as a deflector and switch directs the beam 1420 to optical scanning unit 1430. Ultimately, scanning unit 1430 directs the beam 1420 to the photosensitive layer 1442 of panel 1440, thereby exposing the photosensitive layer 1442 during a pass or scan of the beam 1420. Alternatively, the panel 1440 can be caused to pass by the beam 1420 or a combination of passing the beam 1420 and the panel 1440, relative to each other. Optical switch 1425 in one embodiment is a beam deflector, in particular, an AOM as described above in FIGS. 12A through 13B.

Figure 15:
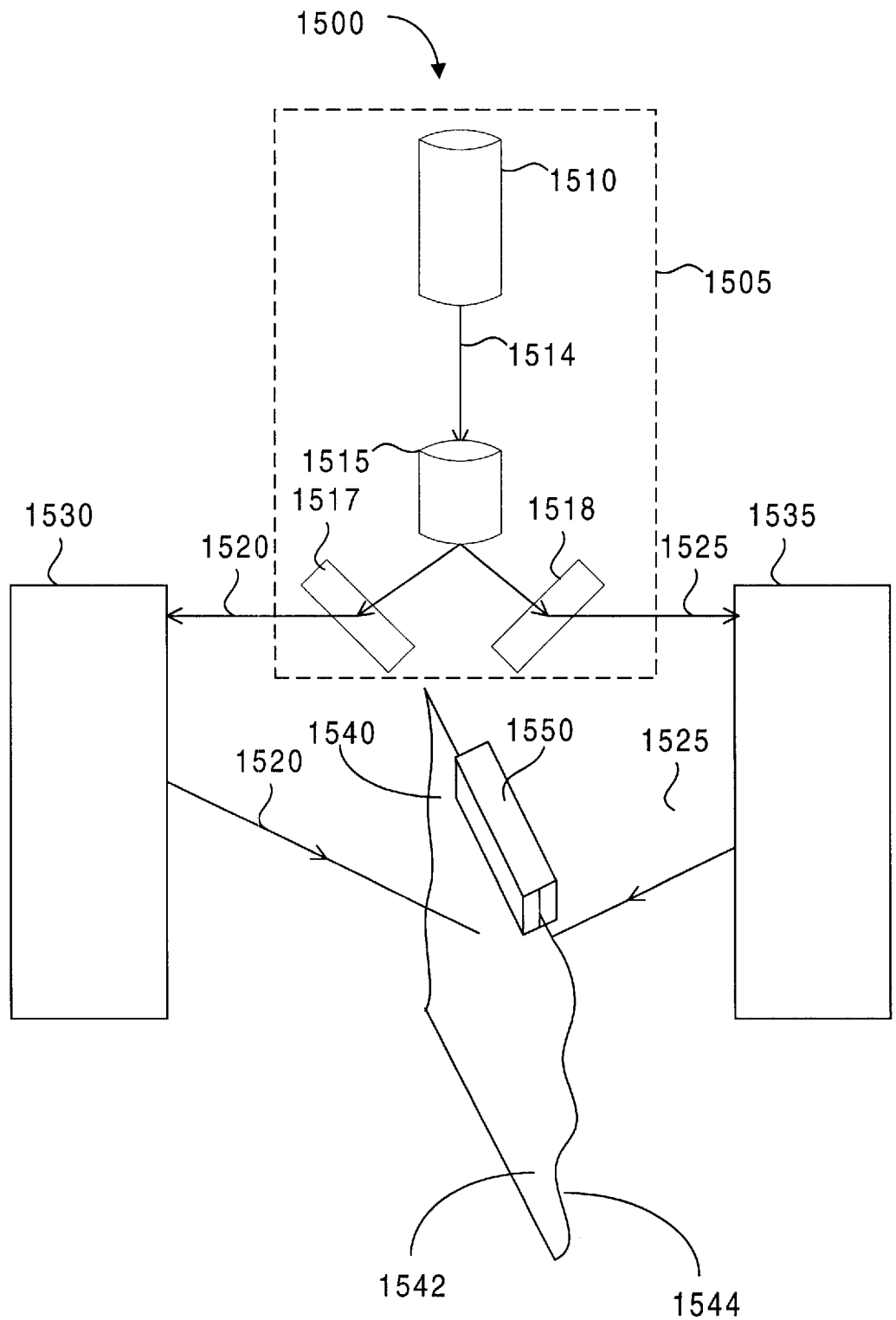
FIG. 15 illustrates a dual side laser direct imaging (LDI) device in accordance with one embodiment of the present invention.

A dual side LDI in accordance with one embodiment of the present invention is illustrated in FIG. 15. One such LDI is described in above-mentioned co-pending U.S. patent application Ser. No. 09/435,983 to Vernackt, et al., entitled METHOD AND DEVICE FOR EXPOSING BOTH SIDES OF A SHEET, which is incorporated herein by reference in its entirety for all purposes.

As shown schematically in FIG. 15, in one embodiment, only one light source 1510 is used for generating both light beams 1520 and 1525. In an alternate embodiment, the two beams 1520 and 1525 are each generated from a different light source. That is, two light sources are used, one for each of optical systems 1530 and 1535. Returning to FIG. 15, light source 1510 of optical system 1505 of exposing apparatus 1500, includes a mode locked UV laser, as described above. The mode locked UV laser generates a main beam 1514 which, alternately, is directed to optical scanning unit 1530 and optical scanning unit 1535, with the alternating switching carried out by means of an optical switch 1515. The optical switch 1515 acts as a deflector and split mirrors 1517 and 1518 direct to optical scanning units 1530 and 1535, respectively. Ultimately, scanning units 1530 and 1535, respectively, direct or scan the two beams 1520 and 1525 toward the photosensitive layers 1542, 1544 on opposing surfaces of panel 1540, thereby exposing both of the photosensitive layers 1542, 1544 during a single pass of the two beams 1520 and 1525. The panel is secured in place by a frame 1550. The frame 1550 can also be movable in the cross scan direction. Alternatively, the panel 1540 can be caused to pass by the two beams 1520, 1525 in the cross scan direction or a combination of passing the two beams 1520, 1525 and the panel 1540, relative to each other.

Alternatively, the optical systems 1530 and 1535 can be movable in the cross scan direction so as to scan the entire surface of the panel 1540. Further alternative embodiments include both the optical systems 1530 and 1535 and the panel 1540 are movable in the cross scan direction so as to scan the entire surface of the panel 1540.

Split mirrors 1517 and 1518 in one embodiment are two faces of a reflecting prism. Optical switch 1515 in one embodiment is a beam deflector, in particular, an AOM deflector. In an alternative embodiment, the split mirrors 1517 and 1518 and optical switch 1515 can be combined into a more efficient AOM such as those described above in FIGS. 12A through 13B.

In yet another alternative embodiment, either of the embodiments illustrated in FIGS. 14 and 15 can also be performed with the panel to be scanned in either a horizontal or vertical orientation.

While various embodiments have been described above, it should be understood that they have been presented by way of example only, and not limitation. Thus, the breadth and scope of a preferred embodiment should not be limited by any of the above described exemplary embodiments, but should be defined only in accordance with the following claims and their equivalents.

What is claimed is:

1. A laser direct imaging apparatus for imaging a pixel on a photosensitive medium with a laser beam, the apparatus comprising:
    a frame for holding a substrate, said substrate having:
        a width of between 6 inches and 25 inches and a length of between 6 inches and 36 inches;
        a first surface and an opposing second surface, said first and second surfaces being substantially planar; and
        a first photosensitive layer on said first surface and a second photosensitive layer on said second surface;
    a UV, mode locked laser operable to emit a pulsed laser beam, said pulsed laser beam having:
        a wavelength of between 200 nm and 532 nm;
        a pulse width of between 1 ps and 20 ps;
        a pulse frequency of between 50 MHz and 400 MHz;
        an average power of between 0.050 watts and 20 watts; and
        a duty cycle of between 125 to 1 and 20,000 to 1;
    an acousto-optical modulator in the optical path between said laser and said substrate, the modulator converting said pulsed laser beam to a modulated pulsed laser beam, said acousto-optical modulator including:
        a crystal oriented to receive said pulsed laser beam; and
        a transducer, said transducer in contact with said crystal, said transducer operable to receive a modulating signal corresponding to pixel data from an external source and to emit said modulating signal into said crystal to modulate said pulsed laser beam by causing an acoustic wave to travel in said crystal at an acoustic speed;
    an optical system to direct said modulated, pulsed laser beam onto said first photosensitive layer on said first surface of said substrate, said modulated pulsed beam being substantially perpendicular to said first surface, said system having an optical magnification between the acousto-optical modulator and said photosensitive layer, said optical system including a first scanner unit to provide relative motion between said modulated, pulsed laser beam on said first photosensitive layer and said substrate in an in-scan direction at an in-scan scanning speed, such that said first scanner unit is operable to expose a first set of pixels on said first photosensitive layer along a first set of scan lines in said in-scan direction,
    wherein the in-scan scanning speed is matched to the acoustic speed and the optical magnification to achieve scophony mode scanning.

2. An apparatus as recited in claim 1, wherein said mode locked laser is a solid state laser.

3. An apparatus as recited in claim 1, wherein said substrate includes a first intermediate layer between said substrate and said first photosensitive layer, and wherein said first intermediate layer is conductive.

4. An apparatus as recited in claim 1, further including:
    a second scanner unit to provide relative motion between said substrate said modulated, pulsed laser beam on said first photosensitive layer in a cross scan direction.

5. An apparatus as recited in claim 1,
    wherein said optical system includes a second scanner unit; and
    wherein said acousto-optical modulator includes a beam switch to switch the direction of said beam between the first scanner unit and the second scanner unit of said optical system, such that said optical system further directs said modulated, pulsed laser beam onto said second photosensitive layer on said second surface of said substrate, said modulated pulsed beam being substantially perpendicular to said first surface when the beam switch is such that the direction of said beam is to the second scanner unit,
    said second scanner unit being to provide relative motion between said modulated, pulsed laser beam on said second photosensitive layer and said substrate in the in-scan direction at the in-scan scanning speed, such that said second scanner unit is operable to expose a second set of pixels on said second photosensitive layer along a second set of scan lines in said in-scan direction.

6. An apparatus as recited in claim 5, wherein said frame is fixed and said first scanner unit and said second scanner unit are movable in a cross scan direction substantially perpendicular to the in-scan direction along the plane of said first substrate surface.

7. A method for laser direct imaging a pixel on a photosensitive medium with a laser beam, comprising:
    providing a substrate in a frame, said substrate including:
        a width of between 6 inches and 25 inches and a length of between 6 inches and 36 inches;
        a first surface and an opposing second surface; said first and second surfaces being substantially planar; and
        a first photosensitive layer on said first surface;
    providing a UV, mode locked pulsed laser beam having;
        a wavelength of between 200 nm and 532 nm;
        a pulse width of between 1 ps and 20 ps;
        a pulse frequency of between 50 MHz and 400 MHz;
        an average power of between 0.050 watts and 20 watts; and
        a duty cycle of between 125 to 1 and 20,000 to 1;
    receiving said laser beam in an acousto-optical modulator having an acoustic speed;
    receiving a modulating signal corresponding to pixel data in said acousto-optical modulator;
    modulating said laser beam in said acousto-optical modulator according to said modulating signal to produce a modulated laser beam;
    receiving said modulated laser beam in an optical system having a first scanner unit; and
    directing said modulated laser beam onto said first photosensitive layer substantially perpendicular to the said first surface and moving said modulated laser beam relative to said substrate in an in-scan direction at an in-scan scanning speed using said first scanning unit to substantially expose a first set of one or more pixels on said first photosensitive layer along a first set of scan lines in said in-scan direction, said optical system providing an optical magnification between the acousto-optical modulator and said photosensitive layer, such that the in-scan scanning speed is matched to the acoustic speed and said optical magnification to achieve scophony mode scanning.

8. A method as recited in claim 7, wherein said mode locked laser is a solid state laser.

9. A method as recited in claim 7, wherein said substrate includes a first intermediate layer between said substrate and said first photosensitive layer, and wherein said first intermediate layer is conductive.

10. A method as recited in claim 7, further comprising: providing relative motion between said modulated laser beam on said first photosensitive layer and said substrate in a cross scan direction substantially perpendicular to said in-scan direction and substantially along the plane of said first surface.

11. A method as recited in claim 7, wherein said substrate further includes a second photosensitive layer on said second surface;

wherein said optical system further includes a second scanning unit;

wherein said method further comprises:
    switching said modulated laser beam between said first scanning unit and said second scanning unit;

wherein said directing and moving said modulated laser beam onto said first photosensitive layer occurs when said modulated laser beam is switched to said first scanning unit;

wherein said method further comprises
    when said modulated laser beam is switched to said second scanning unit, directing said modulated laser beam onto said second photosensitive layer substantially perpendicular to the said second surface and moving said modulated laser beam relative to said substrate in the in-scan direction at the in-scan scanning speed using said second scanning unit to substantially expose a second set of one or more pixels on said second photosensitive layer along a second set of scan lines in said in-scan direction.

12. A method as recited in claim 11, further comprising:

providing relative motion between said modulated laser beam on said first and second photosensitive layers and said substrate in a cross scan direction substantially perpendicular to said in-scan direction and substantially along the plane of said first and second surfaces.

* * * * *